US010192801B2

(12) United States Patent
Lin et al.

(10) Patent No.: US 10,192,801 B2
(45) Date of Patent: Jan. 29, 2019

(54) SEMICONDUCTOR DEVICE AND METHOD OF FORMING VERTICAL INTERCONNECT STRUCTURE IN SUBSTRATE FOR IPD AND BASEBAND CIRCUIT SEPARATED BY HIGH-RESISTIVITY MOLDING COMPOUND

(75) Inventors: Yaojian Lin, Singapore (SG); Jianmin Fang, Singapore (SG); Kang Chen, Singapore (SG); Haijing Cao, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 1012 days.

(21) Appl. No.: 13/424,484

(22) Filed: Mar. 20, 2012

(65) Prior Publication Data

US 2012/0175784 A1 Jul. 12, 2012

Related U.S. Application Data

(62) Division of application No. 12/329,789, filed on Dec. 8, 2008, now Pat. No. 8,168,470.

(51) Int. Cl.
 *H01L 21/48* (2006.01)
 *H01L 23/14* (2006.01)
 (Continued)

(52) U.S. Cl.
 CPC .......... *H01L 23/147* (2013.01); *H01L 21/486* (2013.01); *H01L 21/76898* (2013.01);
 (Continued)

(58) Field of Classification Search
 None
 See application file for complete search history.

(56) References Cited

U.S. PATENT DOCUMENTS 5,250,843 A 10/1993 Eichelberger
5,353,498 A 10/1994 Fillion et al.
 (Continued)

FOREIGN PATENT DOCUMENTS

| JP | WO 2007126090 A1 * | 11/2007 | ......... H01L 21/6835 |
| WO | 98/19337 | 5/1998 | |
| WO | WO 2010024233 A1 * | 3/2010 | ............... H05K 1/11 |

OTHER PUBLICATIONS

English translation Funaya WO2007126090, 30 pgs. downloaded Aug. 19, 2015.*

(Continued)

*Primary Examiner* — David E Graybill
(74) *Attorney, Agent, or Firm* — Robert D. Atkins; Atkins and Associates, P.C.

(57) ABSTRACT

A semiconductor device is made with a conductive via formed through a top-side of the substrate. The conductive via extends vertically through less than a thickness of the substrate. An integrated passive device (IPD) is formed over the substrate. A plurality of first conductive pillars is formed over the first IPD. A first semiconductor die is mounted over the substrate. An encapsulant is formed around the first conductive pillars and first semiconductor die. A second IPD is formed over the encapsulant. An interconnect structure is formed over the second IPD. The interconnect structure operates as a heat sink. A portion of a back-side of the substrate is removed to expose the first conductive via. A second semiconductor die is mounted to the back-side of the substrate. The second semiconductor die is electrically connected to the first IPD and first semiconductor die through the conductive via.

26 Claims, 18 Drawing Sheets

(51) Int. Cl.
*H01L 23/48* (2006.01)
*H01L 21/768* (2006.01)
*H01L 23/498* (2006.01)
*H01L 25/065* (2006.01)

(52) U.S. Cl.
CPC ...... *H01L 23/481* (2013.01); *H01L 23/49816* (2013.01); *H01L 23/49827* (2013.01); *H01L 25/0657* (2013.01); H01L 2224/04042 (2013.01); H01L 2224/0554 (2013.01); H01L 2224/0557 (2013.01); H01L 2224/05571 (2013.01); H01L 2224/05573 (2013.01); H01L 2224/05611 (2013.01); H01L 2224/05624 (2013.01); H01L 2224/05639 (2013.01); H01L 2224/05644 (2013.01); H01L 2224/05647 (2013.01); H01L 2224/05655 (2013.01); H01L 2224/16225 (2013.01); H01L 2224/48247 (2013.01); H01L 2224/73265 (2013.01); H01L 2225/06517 (2013.01); H01L 2225/06541 (2013.01); H01L 2924/00014 (2013.01); H01L 2924/01322 (2013.01); H01L 2924/09701 (2013.01); H01L 2924/10253 (2013.01); H01L 2924/13091 (2013.01); H01L 2924/1433 (2013.01); H01L 2924/181 (2013.01); H01L 2924/19105 (2013.01); H01L 2924/19106 (2013.01); Y10S 438/977 (2013.01)

(56) References Cited

U.S. PATENT DOCUMENTS

| | | | |
|---|---|---|---|
| 5,841,193 A | 11/1998 | Eichelberger et al. | |
| 6,184,060 B1 | 2/2001 | Siniaguine | |
| 6,322,903 B1 | 11/2001 | Siniaguine et al. | |
| 6,356,429 B2* | 3/2002 | Hayashi | H01L 27/0805 257/E27.048 |
| RE37,637 E | 4/2002 | Clifton et al. | |
| 6,420,209 B1 | 7/2002 | Siniaguine | |
| 6,498,381 B2* | 12/2002 | Halahan et al. | 257/449 |
| 6,627,039 B1 | 9/2003 | Siniaguine | |
| 6,639,303 B2* | 10/2003 | Siniaguine | 257/621 |
| 6,664,129 B2* | 12/2003 | Siniaguine | 438/107 |
| 6,693,361 B1 | 2/2004 | Siniaguine et al. | |
| 6,717,254 B2* | 4/2004 | Siniaguine | 257/690 |
| 6,740,582 B2* | 5/2004 | Siniaguine | 438/637 |
| 6,844,241 B2* | 1/2005 | Halahan et al. | 438/454 |
| 6,882,030 B2* | 4/2005 | Siniaguine | 257/621 |
| 6,897,148 B2* | 5/2005 | Halahan et al. | 438/678 |
| 6,958,285 B2* | 10/2005 | Siniaguine | 438/459 |
| 7,001,825 B2* | 2/2006 | Halahan et al. | 438/456 |
| 7,026,223 B2 | 4/2006 | Goodrich et al. | |
| 7,064,005 B2 | 6/2006 | Takaoka et al. | |
| 7,619,901 B2 | 11/2009 | Eichelberger et al. | |
| 7,812,446 B2* | 10/2010 | Kurita | G11C 5/02 257/686 |
| 8,692,135 B2* | 4/2014 | Funaya et al. | 174/264 |
| 8,829,663 B2* | 9/2014 | Pohl | H01L 21/568 257/685 |
| 2001/0028545 A1* | 10/2001 | Hayashi | H01L 27/0805 361/303 |
| 2002/0013061 A1 | 1/2002 | Siniaguine et al. | |
| 2002/0063311 A1 | 5/2002 | Siniaguine | |
| 2002/0084513 A1 | 7/2002 | Siniaguine | |
| 2002/0113321 A1 | 8/2002 | Siniaguine | |
| 2002/0115234 A1 | 8/2002 | Siniaguine | |
| 2002/0115260 A1 | 8/2002 | Halahan et al. | |
| 2002/0115290 A1 | 8/2002 | Halahan et al. | |
| 2002/0127868 A1 | 9/2002 | Siniaguine | |
| 2003/0085460 A1 | 5/2003 | Siniaguine | |
| 2003/0193076 A1 | 10/2003 | Patti | |
| 2003/0222350 A1* | 12/2003 | Sawada | H01L 21/563 257/758 |
| 2004/0048459 A1 | 3/2004 | Patti | |
| 2004/0203224 A1 | 10/2004 | Halahan et al. | |
| 2005/0106845 A1 | 5/2005 | Halahan et al. | |
| 2005/0116337 A1* | 6/2005 | Chua et al. | 257/723 |
| 2005/0170647 A1 | 8/2005 | Halahan et al. | |
| 2005/0224921 A1 | 10/2005 | Gupta et al. | |
| 2006/0021791 A1* | 2/2006 | Sunohara et al. | 174/255 |
| 2006/0084727 A1 | 4/2006 | Yan et al. | |
| 2006/0128119 A1 | 6/2006 | Saito et al. | |
| 2007/0184643 A1* | 8/2007 | Rinne | 438/612 |
| 2008/0265390 A1* | 10/2008 | Kurita | G11C 5/02 257/686 |
| 2008/0315372 A1 | 12/2008 | Kuan et al. | |
| 2008/0315421 A1* | 12/2008 | Periaman | H01L 25/0657 257/758 |
| 2009/0001543 A1* | 1/2009 | Chung | H01L 25/0657 257/686 |
| 2009/0001602 A1* | 1/2009 | Chung | H01L 24/94 257/777 |
| 2009/0008793 A1* | 1/2009 | Pohl et al. | 257/777 |
| 2009/0016032 A1* | 1/2009 | Chow | H01L 25/03 361/749 |
| 2009/0039492 A1* | 2/2009 | Kang | G11C 5/02 257/686 |
| 2009/0140421 A1 | 6/2009 | Lin et al. | |
| 2009/0170242 A1 | 7/2009 | Lin et al. | |
| 2009/0224391 A1 | 9/2009 | Lin et al. | |
| 2009/0230542 A1 | 9/2009 | Lin et al. | |
| 2009/0243083 A1 | 10/2009 | Han et al. | |
| 2009/0294899 A1 | 12/2009 | Pagaila et al. | |
| 2009/0302437 A1 | 12/2009 | Kim et al. | |
| 2009/0302439 A1* | 12/2009 | Pagaila et al. | 257/660 |
| 2010/0001363 A1 | 1/2010 | Frye et al. | |
| 2010/0006994 A1 | 1/2010 | Shim et al. | |
| 2010/0044845 A1* | 2/2010 | Funaya et al. | 257/685 |
| 2010/0059853 A1 | 3/2010 | Lin et al. | |
| 2010/0059854 A1 | 3/2010 | Lin et al. | |
| 2010/0059855 A1 | 3/2010 | Lin et al. | |
| 2010/0065942 A1 | 3/2010 | Lin et al. | |
| 2010/0065948 A1 | 3/2010 | Bae et al. | |
| 2010/0103634 A1* | 4/2010 | Funaya et al. | 361/761 |
| 2010/0127394 A1 | 5/2010 | Ramiah et al. | |
| 2010/0133704 A1 | 6/2010 | Marimuthu et al. | |
| 2010/0140771 A1 | 6/2010 | Huang et al. | |
| 2010/0140772 A1 | 6/2010 | Lin et al. | |
| 2010/0144101 A1 | 6/2010 | Chow et al. | |
| 2012/0175784 A1* | 7/2012 | Lin et al. | 257/774 |

OTHER PUBLICATIONS

Official USPTO English translation, Sawada WO2007126090, translated Sep. 2015. 105 pgs.*

* cited by examiner

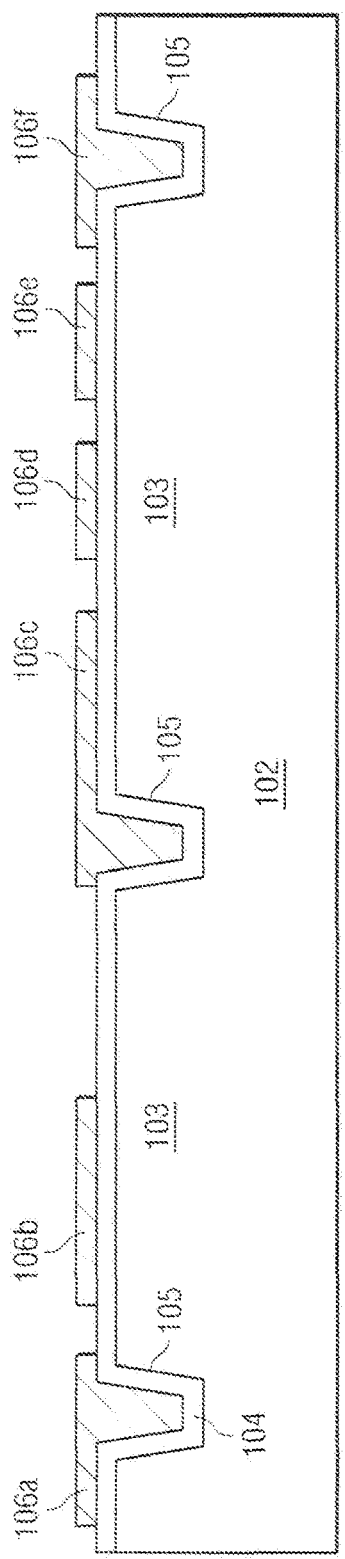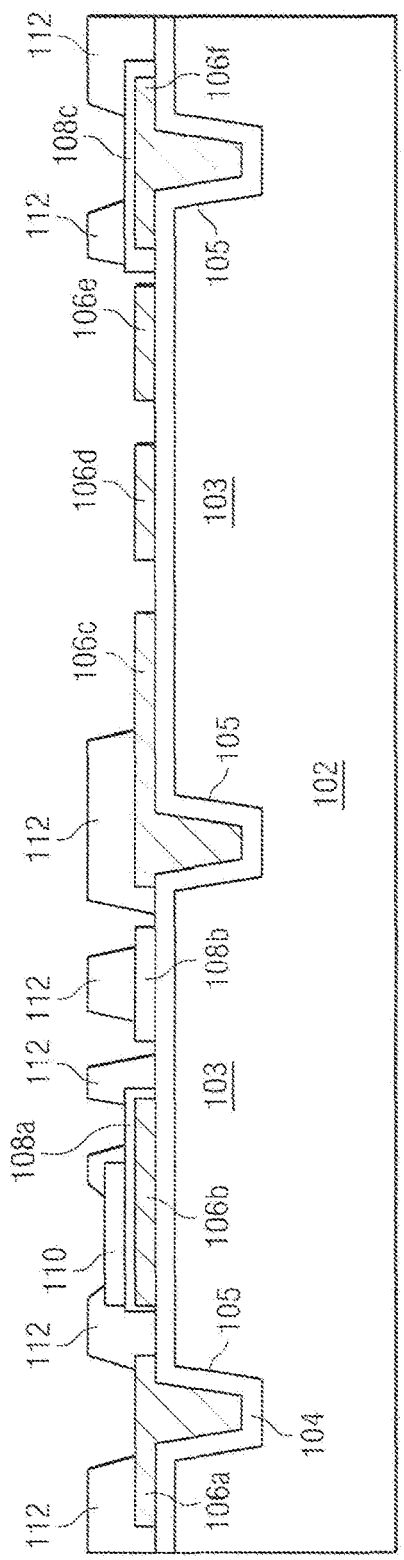

SEMICONDUCTOR DEVICE AND METHOD OF FORMING VERTICAL INTERCONNECT STRUCTURE IN SUBSTRATE FOR IPD AND BASEBAND CIRCUIT SEPARATED BY HIGH-RESISTIVITY MOLDING COMPOUND

CLAIM TO DOMESTIC PRIORITY

The present application is a division of U.S. patent application Ser. No. 12/329,789, now U.S. Pat. No. 8,168,470, filed Dec. 8, 2008, and claims priority to the foregoing application.

FIELD OF THE INVENTION

The present invention relates in general to semiconductor devices and, more particularly, to a semiconductor device having a vertical interconnect structure formed in the substrate for integrated passive devices (IPD) and baseband circuits which are separated by high-resistivity molding compound.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power generation, networks, computers, and consumer products. Semiconductor devices are also found in electronic products including military, aviation, automotive, industrial controllers, and office equipment.

Semiconductor devices exploit the electrical properties of semiconductor materials. The atomic structure of semiconductor material allows its electrical conductivity to be manipulated by the application of an electric field or through the process of doping. Doping introduces impurities into the semiconductor material to manipulate and control the conductivity of the semiconductor device.

A semiconductor device contains active and passive electrical structures. Active structures, including transistors, control the flow of electrical current. By varying levels of doping and application of an electric field, the transistor either promotes or restricts the flow of electrical current. Passive structures, including resistors, diodes, and inductors, create a relationship between voltage and current necessary to perform a variety of electrical functions. The passive and active structures are electrically connected to form logic circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

Another goal of semiconductor manufacturing is to produce higher performance semiconductor devices. Increases in device performance can be accomplished by forming active components that are capable of operating at higher speeds. In high frequency applications, such as radio frequency (RF) wireless communications, integrated passive devices (IPDs) are often contained within the semiconductor device. Examples of IPDs include resistors, capacitors, and inductors. A typical RF system requires multiple IPDs in one or more semiconductor packages to perform the necessary electrical functions. However, high frequency electrical devices generate or are susceptible to undesired electromagnetic interference (EMI) and radio frequency interference (RFI), or other inter-device interference, such as capacitive, inductive, or conductive coupling, also known as cross-talk.

Another goal of semiconductor manufacturing is to produce semiconductor devices with adequate heat dissipation. High frequency semiconductor devices generally generate more heat. Without effective heat dissipation, the generated heat can reduce performance, decrease reliability, and reduce the useful lifetime of the semiconductor device.

High-quality (Q) IPDs used in high frequency applications typically require a high-cost substrate having a high-resistivity, e.g., greater than 1.0 kohm·cm. The IPDs are typically formed side-by-side, or on the same wafer level, which consumes silicon area. In addition, the IPD processes needed to produce high-quality capacitors and resistors require high temperatures to deposit the requisite dielectric layers for these devices. Any coefficient of thermal expansion (CTE) mismatch between the silicon wafer and polymer substrate creates reliability issues. The high-resistivity substrate and high temperature IPD processes add cost and increases overall package size. The interconnect structure for side-by-side IPDs also increases package size.

SUMMARY OF THE INVENTION

A need exists for a semiconductor device having high-quality IPDs with greater interconnect capability. Accordingly, in one embodiment, the present invention is a semiconductor device comprising a substrate and plurality of conductive vias formed in the substrate. A first semiconductor die is mounted over the substrate. An IPD structure is formed over the substrate and disposed away from the first semiconductor die. An encapsulant is deposited over the first semiconductor die and IPD structure. A first interconnect structure is formed over a surface of the encapsulant opposite the IPD structure. A plurality of vertical conductive structures is formed through the encapsulant between the IPD structure and first interconnect structure. A second interconnect structure is formed over a surface of the substrate opposite the IPD structure and electrically connected to the conductive vias.

In another embodiment, the present invention is a semiconductor device comprising a substrate having a plurality of conductive vias formed partially through the substrate. A first semiconductor die is mounted over the substrate. An IPD structure is formed over the substrate and disposed away from the first semiconductor die. An encapsulant is deposited over the first semiconductor die and IPD structure. A first interconnect structure is formed over a surface of the encapsulant opposite the IPD structure.

In another embodiment, the present invention is a semiconductor device comprising a substrate and first semiconductor die mounted over the substrate. An IPD structure is formed over the substrate and disposed away from the first semiconductor die. An encapsulant is deposited over the first semiconductor die and IPD structure. A first interconnect structure is formed over a surface of the encapsulant opposite the IPD structure.

In another embodiment, the present invention is a semiconductor device comprising a substrate having a plurality of conductive vias formed partially through the substrate. A first semiconductor die is mounted over the substrate. An IPD structure is formed over the substrate and disposed away from the first semiconductor die. An encapsulant is deposited over the first semiconductor die and IPD structure.

BRIEF DESCRIPTION OF THE DRAWINGS

FIGS. 3a-3g illustrate a process of making a semiconductor device having a vertical interconnect structure formed through a substrate for IPD and baseband circuits;

DETAILED DESCRIPTION OF THE DRAWINGS

Figure 1:
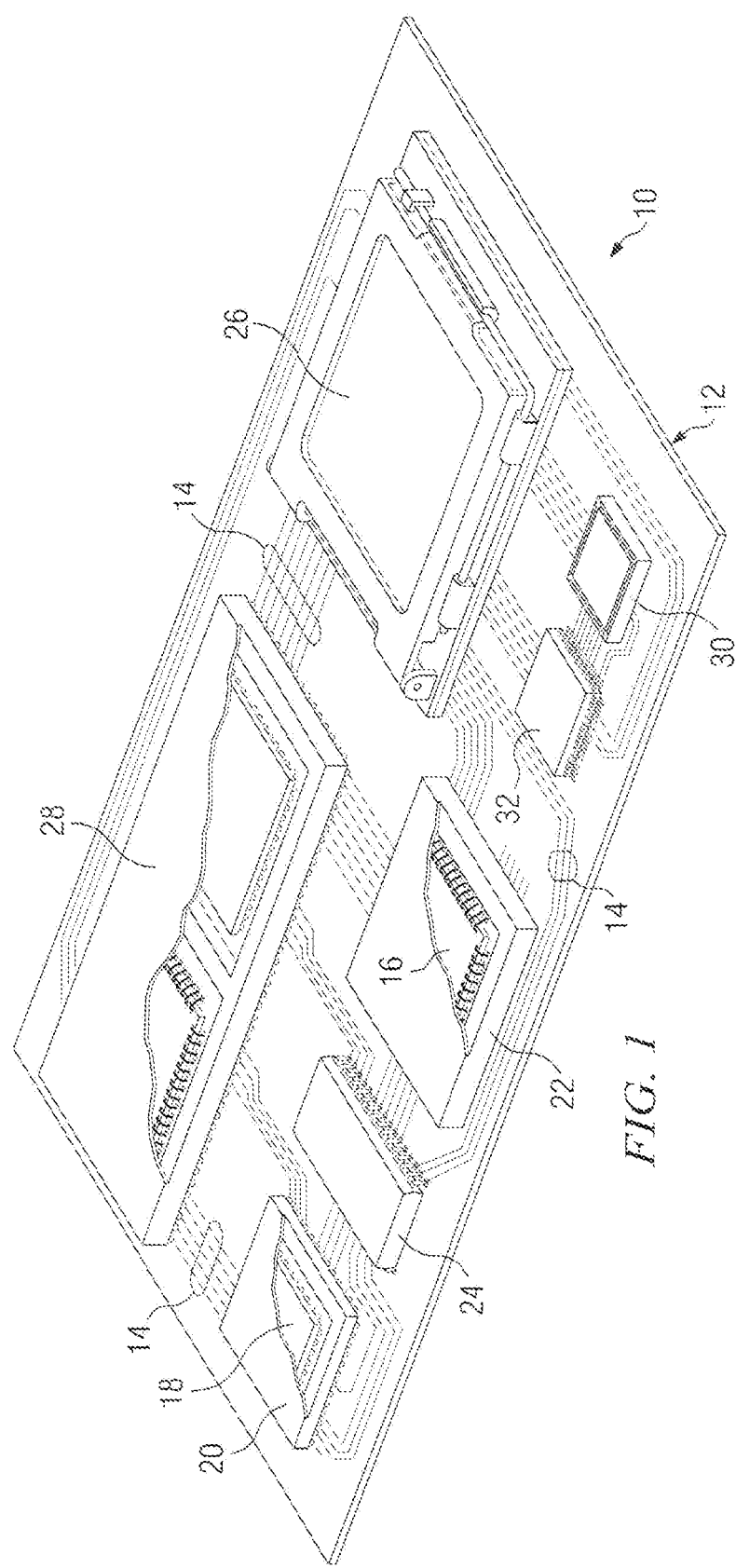
FIG. 1 illustrates a printed circuit board (PCB) with different types of packages mounted to its surface.

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components which are electrically connected to form functional electrical circuits. Active electrical components, such as transistors, have the ability to control the flow of electrical current. Passive electrical components, such as capacitors, inductors, resistors, and transformers, create a relationship between voltage and current necessary to perform electrical circuit functions.

Passive and active components are formed on the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into a permanent insulator, permanent conductor, or changing the way the semiconductor material changes in conductivity in response to an electric field. Transistors contain regions of varying types and degrees of doping arranged as necessary to enable the transistor to promote or restrict the flow of electrical current upon the application of an electric field.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting device or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 10 having a chip carrier substrate or printed circuit board (PCB) 12 with a plurality of semiconductor packages mounted on its surface. Electronic device 10 may have one type of semiconductor package, or multiple types of semiconductor packages, depending on the application. The different types of semiconductor packages are shown in FIG. 1 for purposes of illustration.

Electronic device 10 may be a stand-alone system that uses the semiconductor packages to perform an electrical function. Alternatively, electronic device 10 may be a subcomponent of a larger system. For example, electronic device 10 may be a graphics card, network interface card, or other signal processing card that can be inserted into a computer. The semiconductor package can include microprocessors, memories, application specific integrated circuits (ASICs), logic circuits, analog circuits, RF circuits, discrete devices, or other semiconductor die or electrical components.

In FIG. 1, PCB 12 provides a general substrate for structural support and electrical interconnect of the semiconductor packages mounted on the PCB. Conductive signal traces 14 are formed on a surface or within layers of PCB 12 using evaporation, electrolytic plating, electroless plating, screen printing, PVD, or other suitable metal deposition process. Signal traces 14 provide for electrical communication between each of the semiconductor packages, mounted components, and other external system components. Traces 14 also provide power and ground connections to each of the semiconductor packages.

In some embodiments, a semiconductor device has two packaging levels. First level packaging is the technique for mechanically and electrically attaching the semiconductor die to a carrier. Second level packaging involves mechanically and electrically attaching the carrier to the PCB. In other embodiments, a semiconductor device may only have the first level packaging where the die is mechanically and electrically mounted directly to the PCB.

For the purpose of illustration, several types of first level packaging, including wire bond package 16 and flip chip 18, are shown on PCB 12. Additionally, several types of second level packaging, including ball grid array (BGA) 20, bump chip carrier (BCC) 22, dual in-line package (DIP) 24, land grid array (LGA) 26, multi-chip module (MCM) 28, quad flat non-leaded package (QFN) 30, and quad flat package 32, are shown mounted on PCB 12. Depending upon the system requirements, any combination of semiconductor packages, configured with any combination of first and second level packaging styles, as well as other electronic components, can be connected to PCB 12. In some embodiments, electronic device 10 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a shorter manufacturing process. The resulting devices are less likely to fail and less expensive to manufacture resulting in lower costs for consumers.

Figure 2A:
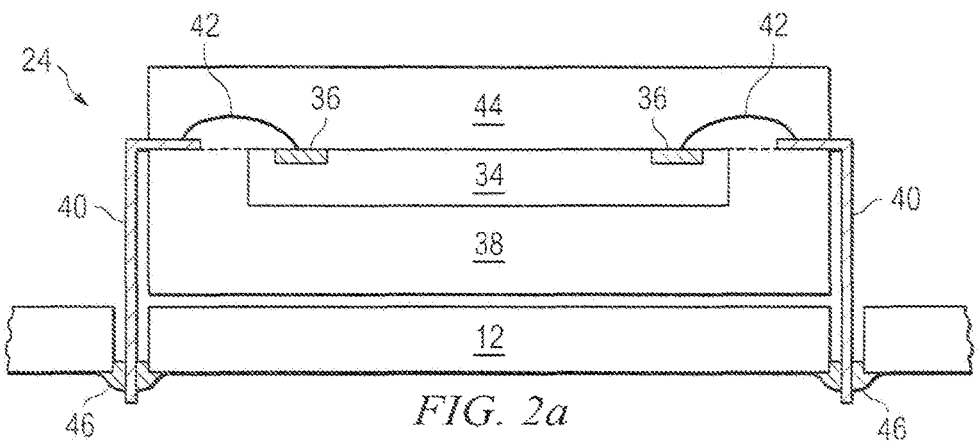
FIGS. 2a-2c illustrate further detail of the representative semiconductor packages mounted to the PCB.

FIG. 2a illustrates further detail of DIP 24 mounted on PCB 12. DIP 24 includes semiconductor die 34 having contact pads 36. Semiconductor die 34 includes an active area containing analog or digital circuits implemented as active devices, passive devices, conductive layers, and dielectric layers formed within semiconductor die 34 and are electrically interconnected according to the electrical design of the die. For example, the circuit may include one or more transistors, diodes, inductors, capacitors, resistors, and other circuit elements formed within the active area of die 34. Contact pads 36 are made with a conductive material, such as aluminum (Al), copper (Cu), tin (Sn), nickel (Ni), gold (Au), or silver (Ag), and are electrically connected to the circuit elements formed within die 34. Contact pads 36 are formed by PVD, CVD, electrolytic plating, or electroless plating process. During assembly of DIP 24, semiconductor die 34 is mounted to a carrier 38 using a gold-silicon eutectic layer or adhesive material such as thermal epoxy. The package body includes an insulative packaging material such as polymer or ceramic. Conductor leads 40 are connected to carrier 38 and wire bonds 42 are formed between leads 40 and contact pads 36 of die 34 as a first level packaging. Encapsulant 44 is deposited over the package for environmental protection by preventing moisture and particles from entering the package and contaminating die 34, contact pads 36, or wire bonds 42. DIP 24 is connected to PCB 12 by inserting leads 40 into holes formed through PCB 12. Solder material 46 is flowed around leads 40 and into the holes to physically and electrically connect DIP 24 to PCB 12. Solder material 46 can be any metal or electrically conductive material, e.g., Sn, lead (Pb), Au, Ag, Cu, zinc (Zn), bismuthinite (Bi), and alloys thereof, with an optional flux material. For example, the solder material can be eutectic Sn/Pb, high-lead, or lead-free.

Figure 2B:
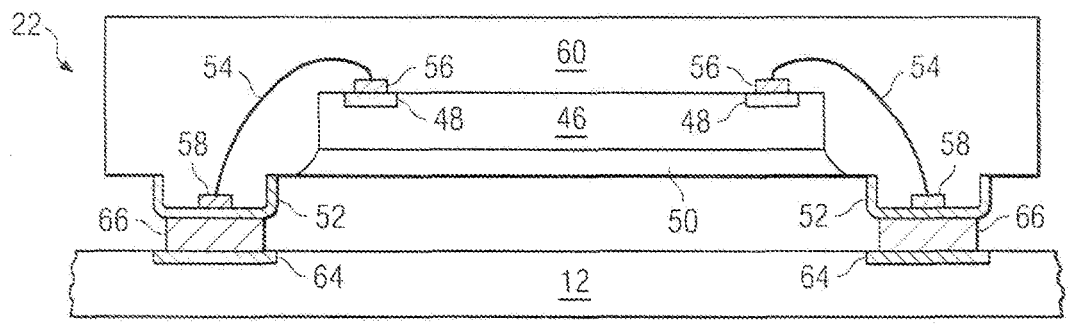

FIG. 2b illustrates further detail of BCC 22 mounted on PCB 12. Semiconductor die 47 is connected to a carrier by wire bond style first level packaging. BCC 22 is mounted to PCB 12 with a BCC style second level packaging. Semiconductor die 47 having contact pads 48 is mounted over a carrier using an underfill or epoxy-resin adhesive material 50. Semiconductor die 47 includes an active area containing analog or digital circuits implemented as active devices, passive devices, conductive layers, and dielectric layers formed within semiconductor die 47 and are electrically interconnected according to the electrical design of the die. For example, the circuit may include one or more transistors, diodes, inductors, capacitors, resistors, and other circuit elements formed within the active area of die 47. Contact pads 48 are made with a conductive material, such as Al, Cu, Sn, Ni, Au, or Ag, and are electrically connected to the circuit elements formed within die 47. Contact pads 48 are formed by PVD, CVD, electrolytic plating, or electroless plating process. Wire bonds 54 and bond pads 56 and 58 electrically connect contact pads 48 of semiconductor die 47 to contact pads 52 of BCC 22 forming the first level packaging. Molding compound or encapsulant 60 is deposited over semiconductor die 47, wire bonds 54, contact pads 48, and contact pads 52 to provide physical support and electrical isolation for the device. Contact pads 64 are formed on a surface of PCB 12 using evaporation, electrolytic plating, electroless plating, screen printing, PVD, or other suitable metal deposition process and are typically plated to prevent oxidation. Contact pads 64 electrically connect to one or more conductive signal traces 14. Solder material is deposited between contact pads 52 of BCC 22 and contact pads 64 of PCB 12. The solder material is reflowed to form bumps 66 which form a mechanical and electrical connection between BCC 22 and PCB 12.

Figure 2C:
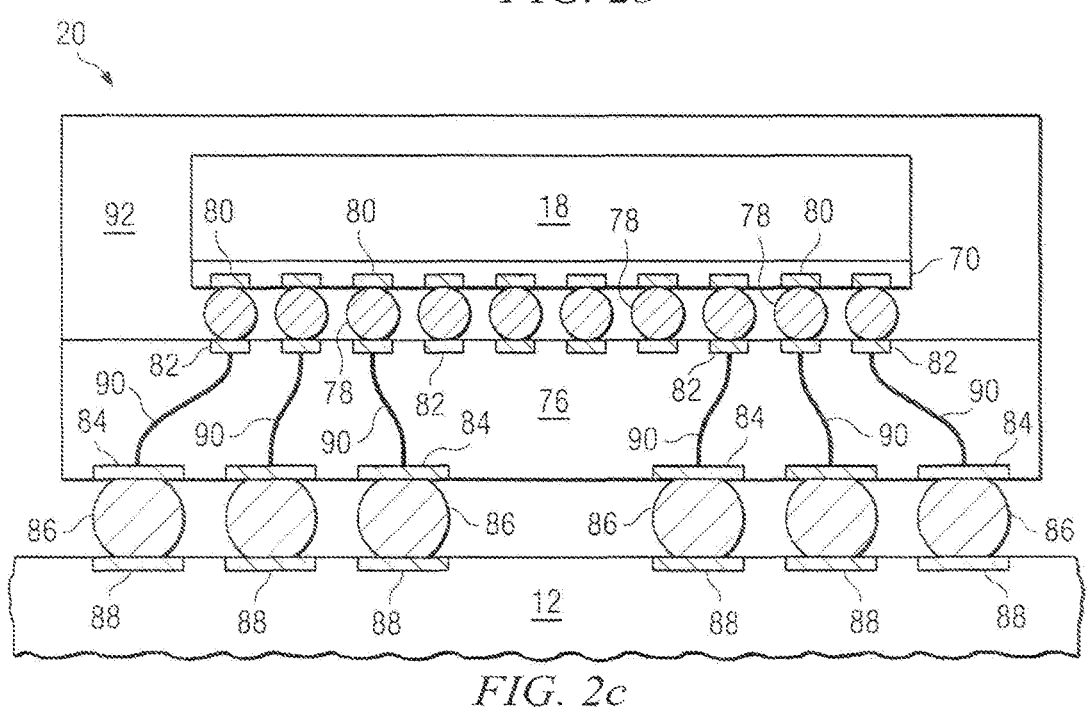

In FIG. 2c, semiconductor die 18 is mounted face down to carrier 76 with a flip chip style first level packaging. BGA 20 is attached to PCB 12 with a BGA style second level packaging. Active area 70 containing analog or digital circuits implemented as active devices, passive devices, conductive layers, and dielectric layers formed within semiconductor die 18 is electrically interconnected according to the electrical design of the die. For example, the circuit may include one or more transistors, diodes, inductors, capacitors, resistors, and other circuit elements formed within active area 70 of semiconductor die 18. Semiconductor die 18 is electrically and mechanically attached to carrier 76 through a large number of individual conductive solder bumps or balls 78. Solder bumps 78 are formed on bump pads or interconnect sites 80, which are disposed on active areas 70. Bump pads 80 are made with a conductive material, such as Al, Cu, Sn, Ni, Au, or Ag, and are electrically connected to the circuit elements formed in active area 70. Bump pads 80 are formed by PVD, CVD, electrolytic plating, or electroless plating process. Solder bumps 78 are electrically and mechanically connected to contact pads or interconnect sites 82 on carrier 76 by a solder reflow process.

BGA 20 is electrically and mechanically attached to PCB 12 by a large number of individual conductive solder bumps or balls 86. The solder bumps are formed on bump pads or interconnect sites 84. The bump pads 84 are electrically connected to interconnect sites 82 through conductive lines 90 routed through carrier 76. Contact pads 88 are formed on a surface of PCB 12 using evaporation, electrolytic plating, electroless plating, screen printing, PVD, or other suitable metal deposition process and are typically plated to prevent oxidation. Contact pads 88 electrically connect to one or more conductive signal traces 14. The solder bumps 86 are electrically and mechanically connected to contact pads or bonding pads 88 on PCB 12 by a solder reflow process. Molding compound or encapsulant 92 is deposited over semiconductor die 18 and carrier 76 to provide physical support and electrical isolation for the device. The flip chip semiconductor device provides a short electrical conduction path from the active devices on semiconductor die 18 to conduction tracks on PCB 12 in order to reduce signal propagation distance, lower capacitance, and achieve overall better circuit performance. In another embodiment, the semiconductor die 18 can be mechanically and electrically attached directly to PCB 12 using flip chip style first level packaging without carrier 76.

Figure 3C:
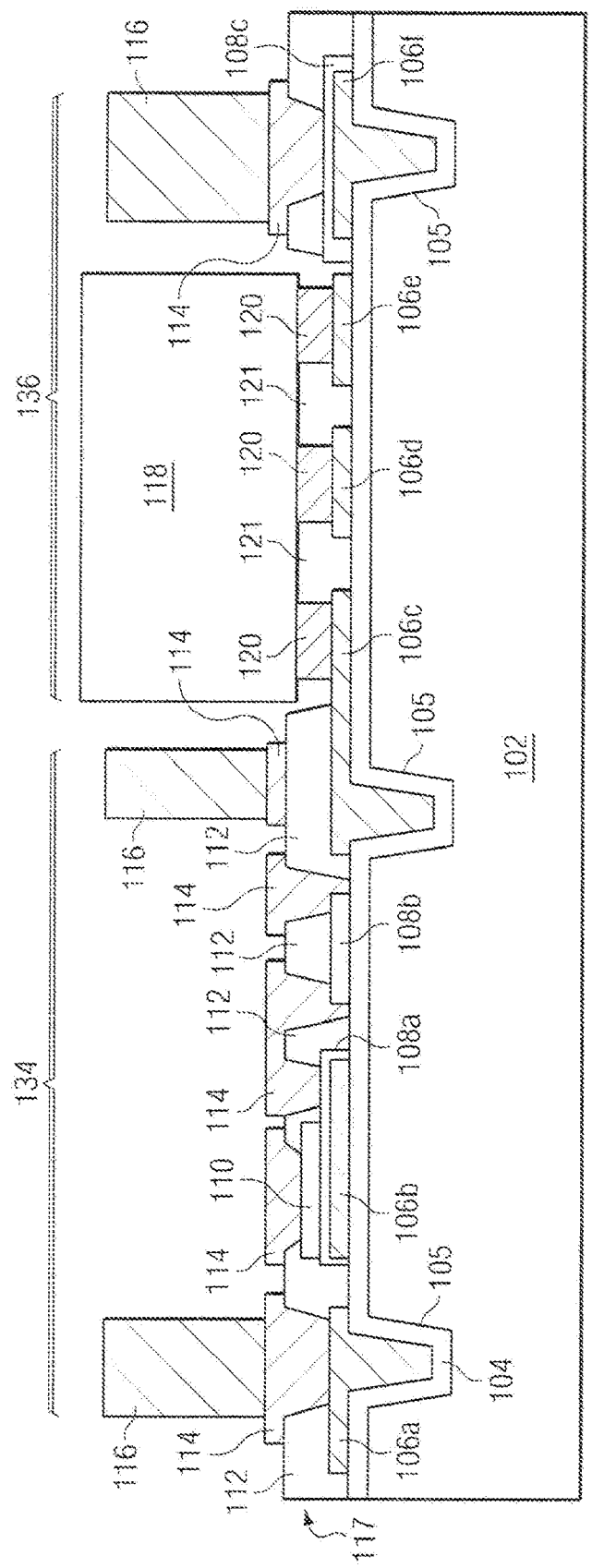

FIGS. 3a-3g illustrate a process of forming a vertical interconnect structure through a substrate for an integrated passive device (IPD) with a high-resistivity molding compound. In FIG. 3a, a substrate 102 of wafer 100 contains dummy or sacrificial base material such as silicon (Si), polymer, polymer composite, metal, ceramic, glass, glass epoxy, beryllium oxide, or other suitable low-cost, rigid material or bulk semiconductor material for structural support. Alternatively, substrate 102 can be other semiconductor base materials such as germanium, gallium arsenide, indium phosphide, or silicon carbide. A plurality of semiconductor die is formed on wafer 100 using semiconductor manufacturing processes described above. Each semiconductor die contains analog or digital circuits formed in active region 103. The semiconductor die may also contain IPD, such as inductors, capacitors, and resistors, in or above active region 103. Alternatively, there may be no circuitry in region 103 as substrate 102 is blanketed before the TSV process.

A plurality of through silicon vias (TSV) 105 is formed in a surface of substrate 102 using a laser drilling, DRIE Si etching, or other etching operation. In this embodiment, TSVs 105 extend below active region 103, but not completely through substrate 102. Wafer 100 has a typical thickness of 725 micrometers ($\mu$m) for an 8-inch wafer. TSVs 105 extend less than a thickness of wafer 100, and has the depth typically <100 $\mu$m. An insulating or passivation layer 104 is formed on substrate 102 and into TSV 105. The insulating layer 104 can be silicon dioxide (SiO2), silicon nitride (Si3N4), silicon oxynitride (SiON), tantalum pentoxide (Ta2O5), zircon (ZrO2), aluminum oxide (Al2O3), polyimide, benzocyclobutene (BCB), polybenzoxazoles (PBO), or other material having similar insulating and structural properties. The insulating layer 104 is conformally deposited using PVD, CVD, printing, spray coating, sintering or thermal oxidation to follow the contour of the wafer surface including covering the inner surface of TSVs 105. The insulating layer 104 can be made with single or multiple layers.

An electrically conductive layer 106 is formed on insulating layer 104 using a patterning and deposition process to form individual portions or sections 106a-106f. The individual portions of conductive layer 106 can be electrically common or electrically isolated depending on the connectivity of the individual semiconductor die formed on wafer 100. Conductive layer 106 fills or conformally coats TSV 105 as one layer with selective plating, or by separate metal deposition with plating associated with CMP process, then PVD associated with CMP or etch-back process. For example, TSV 105 is filled by plated Cu, followed by CMP. Conductive layer 106b is deposited separately by with PVD and etch-back process. The deposition of conductive layer 106 uses PVD, CVD, electrolytic plating, or electroless plating process. In one embodiment, conductive layer 106 is stacked Ti/Cu, TiW/Cu, TiN/Cu, Ti/TiN/Cu, or Ta/TaN/Cu with Ti, TiW, TiN, Ti/TiN and Ta/TaN as adhesion and barrier layer. Alternately, conductive layer 106 can be Al, Cu, Sn, Ni, Au, Ag, or other suitable electrically conductive material with optional adhesion and barrier layers containing titanium (Ti), titanium tungsten (TiW), titanium nitride (TiN), tantalum (Ta), NiV, or tantalum nitride (TaN). The seed layer and adhesion/barrier layer are etched using conductive layer 106 as a hard mark or with CMP process. The surface of conductive layer 106 can be smoothed by CMP, metal grinding, or polishing for later formation of passive devices.

In FIG. 3b, a resistive layer 108 is deposited and patterned on conductive layers 106 and insulating layer 104 using PVD or CVD. Resistive layer 108 has individual portions or sections 108a-108c. Resistive layer 108a is deposited over conductive layer 106b. Resistive layer 108b is deposited over insulating layer 104 between conductive layers 106b-106c. Resistive layer 108c is formed over conductive layer 106f. Resistive layer 108 is tantalum silicide (TaxSiy) or other metal silicides, TaN, nickel chromium (NiCr), TiN, or doped poly-silicon having a typical surface resistivity Rs between 5 and 100 ohm/sq. The plating seed layer for conductive layer 106 may be formed after deposition of resistive layer 108.

An insulating layer 110 is formed over resistive layer 108a using a deposition and patterning process. The insulating layer 110 is Si3N4, SiO2, SiON, Ta2O5, ZnO, ZrO2, Al2O3, or other suitable dielectric material. The deposition of insulating layer 110 may involve PVD, CVD, spin coating, printing, sintering or thermal oxidation. Resistive layer 108 and insulating layer 110 are formed with the same mask and etched at the same time. Alternatively, resistive layer 108 and insulating layer 110 can be patterned and etched with a different mask.

A passivation layer 112 is formed over insulating layer 104, conductive layer 106, resistive layer 108, and insulating layer 110. Passivation layer 112 can be polyimide, BCB, PBO, SiO2, Si3N4, SiON, or other similar insulating and structural properties. The deposition of passivation layer 112 may involve spin coating, PVD, CVD, printing, sintering, or thermal oxidation. A portion of passivation layer 112 is removed to expose conductive layer 106a, insulating layer 110, resistive layer 108a-108c, insulating layer 104, and conductive layer 106c-106e, as shown in FIG. 3b.

In FIG. 3c, an electrically conductive layer 114 is formed over conductive layer 106a, insulating layer 110, insulating layer 104, resistive layer 108a-108c, and passivation layer 112. Conductive layer 114 is Al, Cu, Sn, Ni, Au, Ag, or other suitable electrically conductive material. In one embodiment, conductive layer 114 is patterned with etch-back and selective plating process. The deposition of conductive layer 114 may also use PVD, CVD, electrolytic plating, or electroless plating process. Conductive layer 114 uses an adhesion layer of Ti or TiW.

Conductive pillars or posts 116 are formed over conductive layer 114. The dimension of conductive pillars 116 can be the same or different. Conductive pillars 116 can be Cu, Al, W, Au, solder, or other suitable electrically conductive material. In one embodiment, to form conductive pillars 116, a seed layer with Ti as adhesion and Cu as seeding layer, and a thick layer of photoresist, e.g., 50-200 µm, is deposited over insulating layer 112 and conductive layer 114. The photoresist can be a liquid or a dry film. Two layers of photoresist may be applied to achieve the desired thickness. The photoresist is patterned and metal is selectively deposited in the patterned and opened areas of the photoresist using electrolytic plating or electroless plating process. The photoresist is stripped away leaving behind individual conductive pillars 116. In another embodiment, the conductive pillars 116 can be implemented as solder balls or stud bumps.

The structures described in FIGS. 3a-3c, e.g., the combination of conductive layer 106, resistive layer 108, insulating layer 110, and conductive layer 114, constitute one or more passive circuit elements or IPDs 117. For example, conductive layer 106b, resistive layer 108a, insulating layer 110, and conductive layer 114 is a metal-insulator-metal (MIM) capacitor. Resistive layer 108b is a resistor element in the passive circuit. The MIM capacitor and resistor are formed with process temperature typically greater than 200° C. The resistor is optional. Other active and passive circuit elements can be formed on wafer 100 as part of the electrically functional semiconductor device.

The IPDs 117 contained within wafer 100 provide the electrical characteristics needed for high frequency applications, such as resonators, high-pass filters, low-pass filters, band-pass filters, symmetric Hi-Q resonant transformers, matching networks, and tuning capacitors. The IPDs can be used as front-end wireless RF components, which can be positioned between the antenna and transceiver. The IPD inductor can be a hi-Q balun, transformer, or coil, operating up to 100 Gigahertz. In some applications, multiple baluns are formed on a same substrate, allowing multi-band operation. For example, two or more baluns are used in a quad-band for mobile phones or other global system for mobile (GSM) communications, each balun dedicated for a frequency band of operation of the quad-band device. A typical RF system requires multiple IPDs and other high frequency circuits in one or more semiconductor packages to perform the necessary electrical functions. However, high frequency electrical devices generate or are susceptible to undesired EMI, RFI, or other inter-device interference, such as capacitive, inductive, or conductive coupling, also known as cross-talk.

Note in FIG. 3c that high frequency IPDs are contained within region 134 of wafer 100. Baseband components are contained within region 136 of wafer 100. The high frequency IPDs are thus separated from the baseband DC components to reduce electromagnetic interference (EMI) and radio frequency interference (RFI), and other inter-device interference between the devices, such as capacitive, inductive, or conductive coupling, also known as cross-talk. High frequency components in region 134 and baseband components in region 136 constitute a system-in-package (SiP) arrangement.

A semiconductor device 118 is mounted to conductive layer 106c-106e using electrical connections 120, e.g., solder bumps, metal bonding for flip chip interconnect, or conductive paste. For example, semiconductor die 118 can be a baseband digital circuit, such as digital signal processor (DSP), memory, or other signal processing circuit. An optional underfill fillet 121 or shown here is applied beneath semiconductor device 118. Note that a top surface of conductive pillar 116 and semiconductor device 118 have about the same height. Alternatively, if conductive pillar 116 and semiconductor device 118 have different heights, then semiconductor device 118 is typically made higher. In other embodiments, conductive pillars 116 are higher than semiconductor device 118.

Figure 3D:
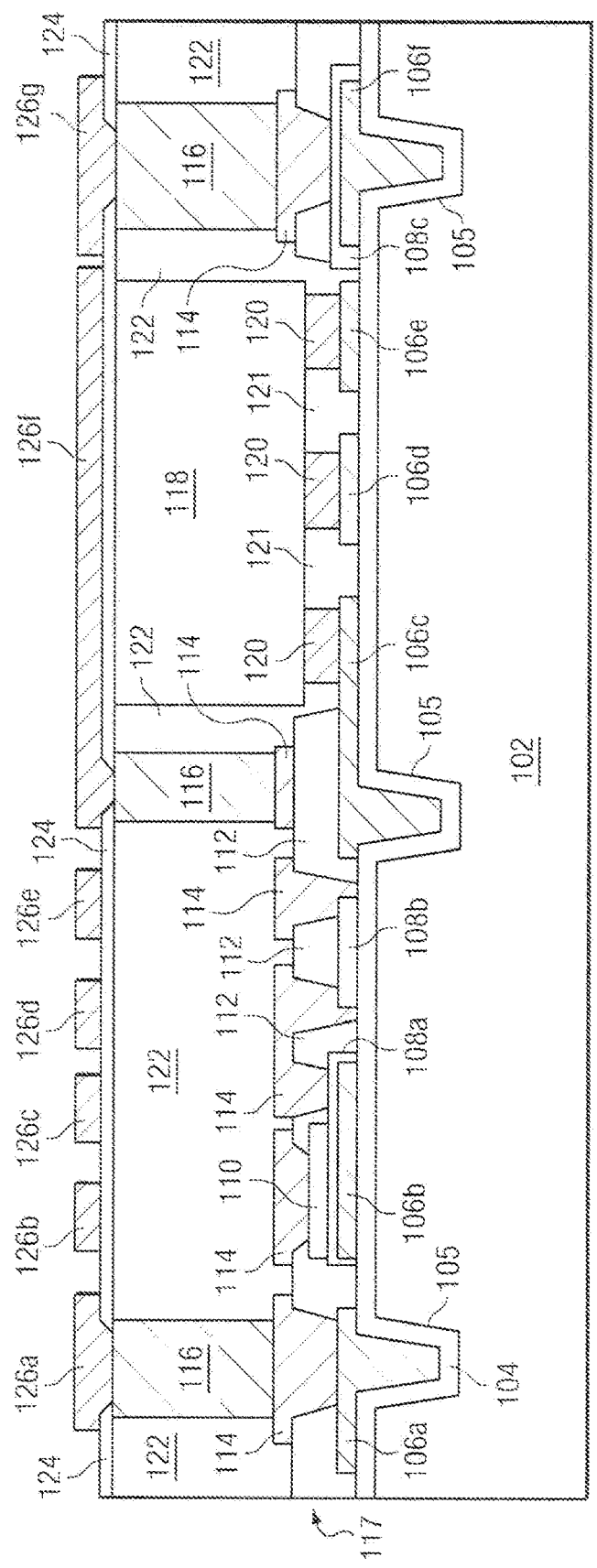

FIG. 3d shows an encapsulant or molding compound 122 is deposited over the IPD structure and around conductive pillars 116 and semiconductor device 118 using a paste printing, compressive molding, transfer molding, liquid encapsulant molding, vacuum lamination, or other suitable applicator. Encapsulant 122 extends to a top surface of conductive pillars 116. Encapsulant 122 can be epoxy resin with filler, epoxy acrylate with filler, polymer, LCP (liquid crystal polymer) film, or other polymer composite material. Encapsulant 122 is non-conductive and environmentally protects the semiconductor device from external elements and contaminants. Encapsulant 122 has a coefficient of thermal expansion (CTE) that is adjusted to match that of the base semiconductor material, e.g., Si, with glass transition temperature (Tg) greater than 100° C. to reduce warpage and increase inductor Q-factor. The CTE of encapsulant 122 can be adjusted using a filler such as a powder, fiber, or cloth additive. A suitable encapsulant material is generally characterized by low-shrinkage, high-resistivity of greater than 1.0 kohm·cm, low-dielectric constant of less than 4, and low-loss tangent of less than 0.05 in 500 MHz to 30 GHz range. Encapsulant 122 may undergo grinding or etch-back to expose conductive pillars 116, and the backside of die 118.

An insulating layer 124 is formed over conductive pillars 116, semiconductor device 118, and encapsulant 122 using spin coating, paste printing, or laminate with an adhesive. The insulating layer 124 can be low temperature cured (<250° C.) polymer dielectric, UV cured solder resist, or other suitable insulation material. A portion of insulating layer 124 is removed using an etching process, such as wet lithography development or laser drilling to expose conductive pillars 116. The insulating layer 124 is optional.

An electrically conductive layer 126 is formed over encapsulant 122, insulating layer 124, and conductive pillars 116 using a deposition and patterning process to form individual portions or sections 126a-126g. The individual portions of conductive layer 126 can be electrically common or electrically isolated depending on the connectivity of the individual semiconductor die formed on wafer 100. Conductive layer 126 can be Al, Cu, Sn, Ni, Au, Ag, or other suitable electrically conductive material with optional adhesive and barrier layer. In one embodiment, conductive layer 126 is patterned with selective plating process and etch-back with an adhesion and seed layer. The deposition of conductive layer 126 may also use PVD, CVD, electrolytic plating, or electroless plating process.

Figure 3E:
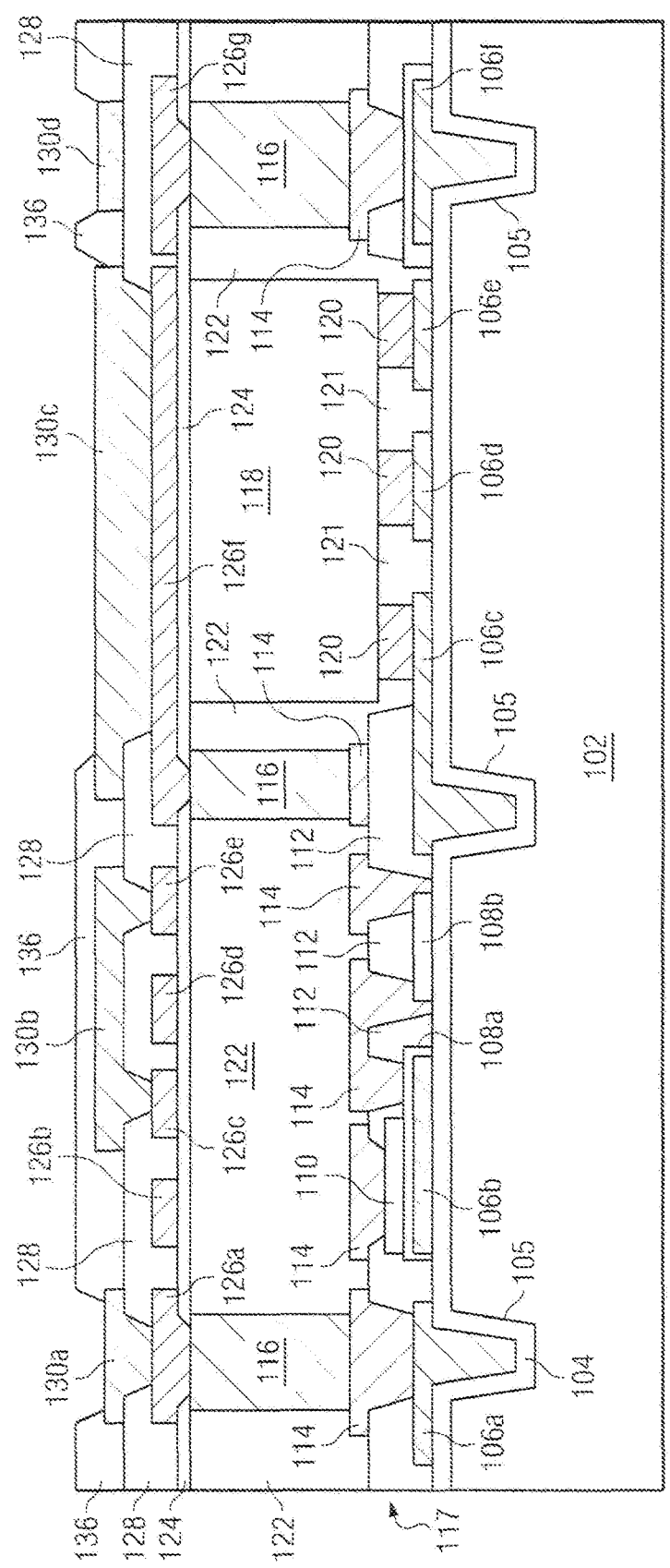

In FIG. 3e, an insulating layer 128 is formed over insulating layer 124 and conductive layer 126 using a deposition and patterning process. The insulating layer 128 can be low temperature cured (<250° C.) polymer dielectric, UV cured solder resist, SiO2, Si3N4, SiON, or other suitable insulation material. The deposition of insulating layer 128 may involve CVD, PVD, spin coating, printing, or molding process. A portion of insulating layer 128 is removed using an etching process to expose conductive layer 126a, 126c, 126e, and 126f.

An electrically conductive layer 130 is formed over insulating layer 128 and conductive layer 126 using a deposition and patterning process to form individual portions or sections 130a-130d. The individual portions of conductive layer 130 can be electrically common or electrically isolated depending on the connectivity of the individual semiconductor die formed on wafer 100. Conductive layer 130 can be Al, Cu, Sn, Ni, Au, Ag, or other suitable electrically conductive material with optional adhesion and barrier layer. The deposition of conductive layer 130 uses PVD, CVD, electrolytic plating, or electroless plating process.

An insulating layer 136 is formed over insulating layer 128 and conductive layer 130 using a blanket process or a deposition and patterning process. The insulating layer 136 can be low temperature cured (<250° C.) polymer dielectric, UV cured solder resist, SiO2, Si3N4, SiON, or other suitable insulation material The deposition of insulating layer 136 may involve spin coating, lamination, printing, or molding process. A portion of insulating layer 136 is removed using an etching process to expose conductive layer 130a, 130c, and 130d.

The conductive layer 126b-126e together with 130b constitute an IPD, in this case an inductor. The conductive layer 126b-126e is typically wound or coiled in plan-view to produce or exhibit the desired inductive properties. Conductive layer 130 acts as the bridge of the inductor like 130b. Alternatively, conductive layer 130 is the inductor and conductive layer 126 can be the inductor bridge. Conductive layer 126b-126e is formed over encapsulant 122 and insulating layer 124. The inductor 126b-126e is separated from IPDs 117, i.e., MIM capacitor and resistive layer 108b, by the thickness of encapsulant 122 and insulating layer 124, e.g., typically >about 50 µm. By forming the inductor over encapsulant 122, which has high resistivity, low loss tangent, low dielectric constant, and matching CTE, high quality IPDs can be realized, without using a high-resistivity substrate. In addition, vertically separating the inductor from the MIM capacitor and resistor with high-resistivity encapsulant 122, i.e., stacking the IPDs rather than spacing them laterally across the die, saves silicon area and provides a smaller package. Other types of IPDs, such as capacitors and resistors, can be formed over the high-resistivity encapsulant 122 and insulating layer 124. Conductive layer 126a, 126f, and 126g electrically connect to conductive pillars 116.

Figure 3F:
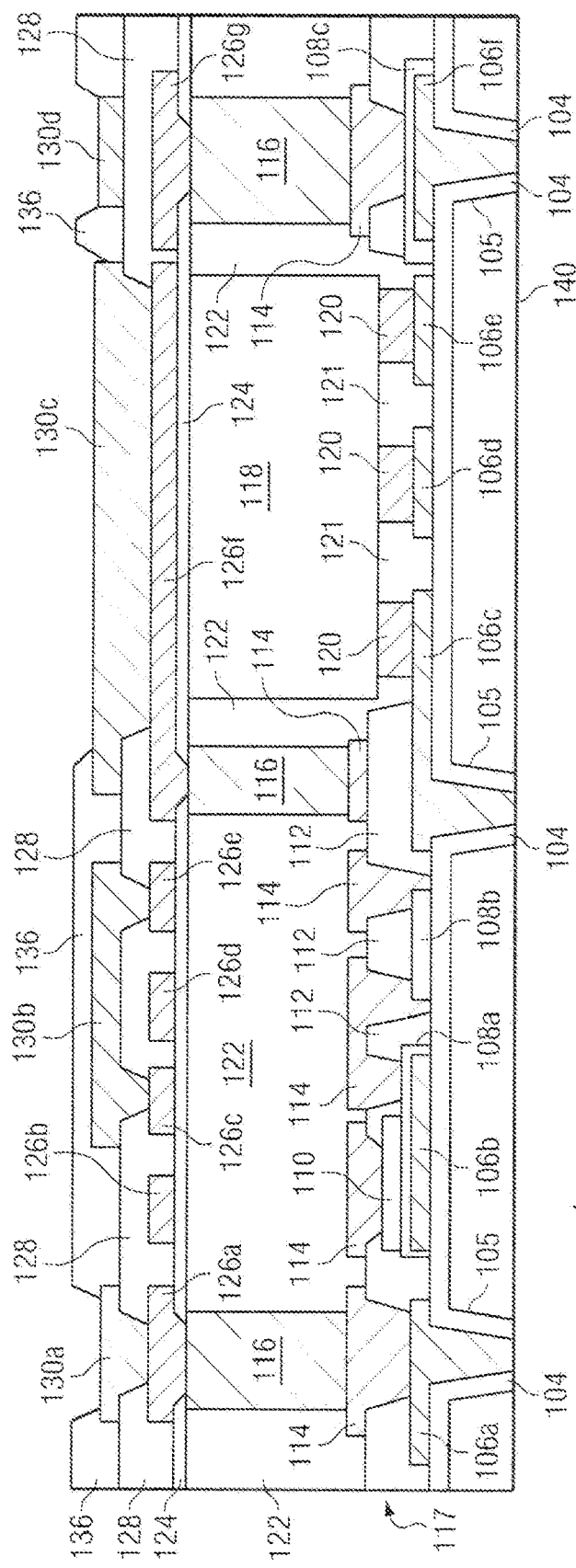

FIG. 3f shows substrate 102 following backgrinding which removes a sufficient amount of the bulk semiconductor material to expose conductive layer 106a, 106c, and 106f in TSV 105 on back surface 140 of substrate 102. The backgrinding may involve mechanical grinding, CMP, wet etching, or dry etching. Thus, conductive TSV 105 provides part of the electrical interconnect for the semiconductor die and IPDs in the semiconductor package.

Figure 3G:
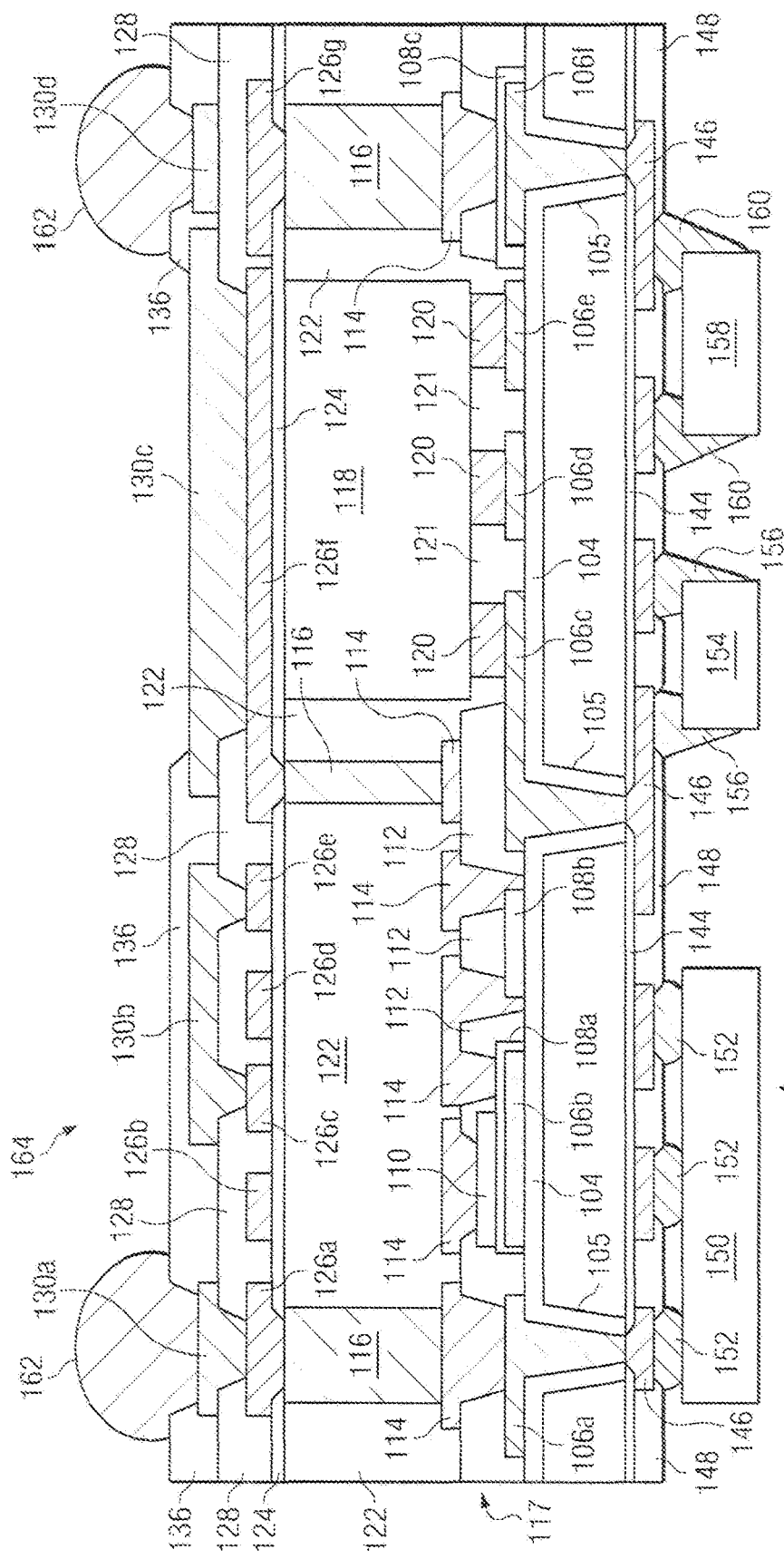

In FIG. 3g, an insulating layer 144 is formed over back surface 140 using a patterning and deposition process. The insulating layer 144 can be Si3N4, SiO2, SiON, low temperature cured (<250° C.) polymer dielectric, UV cured solder resist, or other suitable insulating material. The deposition of insulating layer 144 may involve CVD, PVD, spin coating, lamination, paste printing, or molding process. A portion of insulating layer 144 is removed using an etching process to expose conductive layer 106a, 106c, and 106f.

An electrically conductive layer 146 is formed over insulating layer 144 and conductive layer 106 using a depositing and patterning process. Conductive layer 146 can be Al, Cu, Sn, Ni, Au, Ag, or other suitable electrically conductive material with optional adhesion and barrier layer. The deposition of conductive layer 146 uses PVD, CVD, electrolytic plating, or electroless plating process.

An insulating layer 148 is formed over insulating layer 144 and conductive layer 146 using a patterning and deposition process. The insulating layer 148 can be Si3N4, SiO2, SiON, low temperature cured (<250° C.) polymer dielectric, UV cured solder resist, or other suitable insulating material. The deposition of insulating layer 148 may involve CVD, PVD, spin coating, lamination, printing, or molding process. A portion of insulating layer 148 is removed using an etching process to expose conductive layer 146.

A semiconductor die 150 is mounted to conductive layer 146 with solder bumps 152. Likewise, surface mounted components 154 is mounted to conductive layer 146 with electrical connections 156, and surface mounted components 158 is mounted to conductive layer 146 with electrical connections 160. Semiconductor die 150, 154, and 158 may contain digital circuit components, such as baseband signal processing circuits or memory devices. An electrically conductive solder material is deposited over conductive layer 130a and 130d using an evaporation, electrolytic plating, electroless plating, ball drop, or screen printing process. The solder material can be any metal or electrically conductive material, e.g., Sn, Ni, Au, Ag, Pb, Bi, and alloys thereof, with an optional flux material. For example, the solder material can be eutectic Sn/Pb, high-lead, or lead-free. The solder material is reflowed by heating the material above its melting point to form spherical balls or bumps 162. In some applications, solder bumps 162 are reflowed a second time to improve electrical contact to conductive layer 130. Solder bumps 162 represent one type of interconnect structure that can be formed on conductive layer 130. The interconnect structure can also use bond wires, 3D interconnects, conductive paste, or other electrical interconnect.

Typically, semiconductor die 150, 154, and 158 are mounted on TSV side after forming solder ball 162, and either before or after singulated 164 mounted on next level package. Alternatively, semiconductor die 150, 154, and 158 can be mounted on the other side of 100, while solder ball is at the TSV side of 100. The final semiconductor package 164 in FIG. 3g is suitable for higher level integration. Semiconductor die 150, 154, and 158 electrically connect to IPDs 117, semiconductor die 118, and external components through conductive pillars 116, solder bumps 152 and 162, electrical connections 120, 156, and 162, conductive TSVs 105, and conductive layers 106, 114, 126, 130, and 146. The IPDs 117 and semiconductor devices 118, 150, 154, and 158 generate heat during normal operation. In one embodiment, conductive layer 130 acts as a heat sink to conduct thermal energy away from IPD 117 and semiconductor die 118, 150, 154, and 158 by way of conductive pillars 116 and conductive layer 126 which reduces the operating temperature of these devices.

Figure 4:
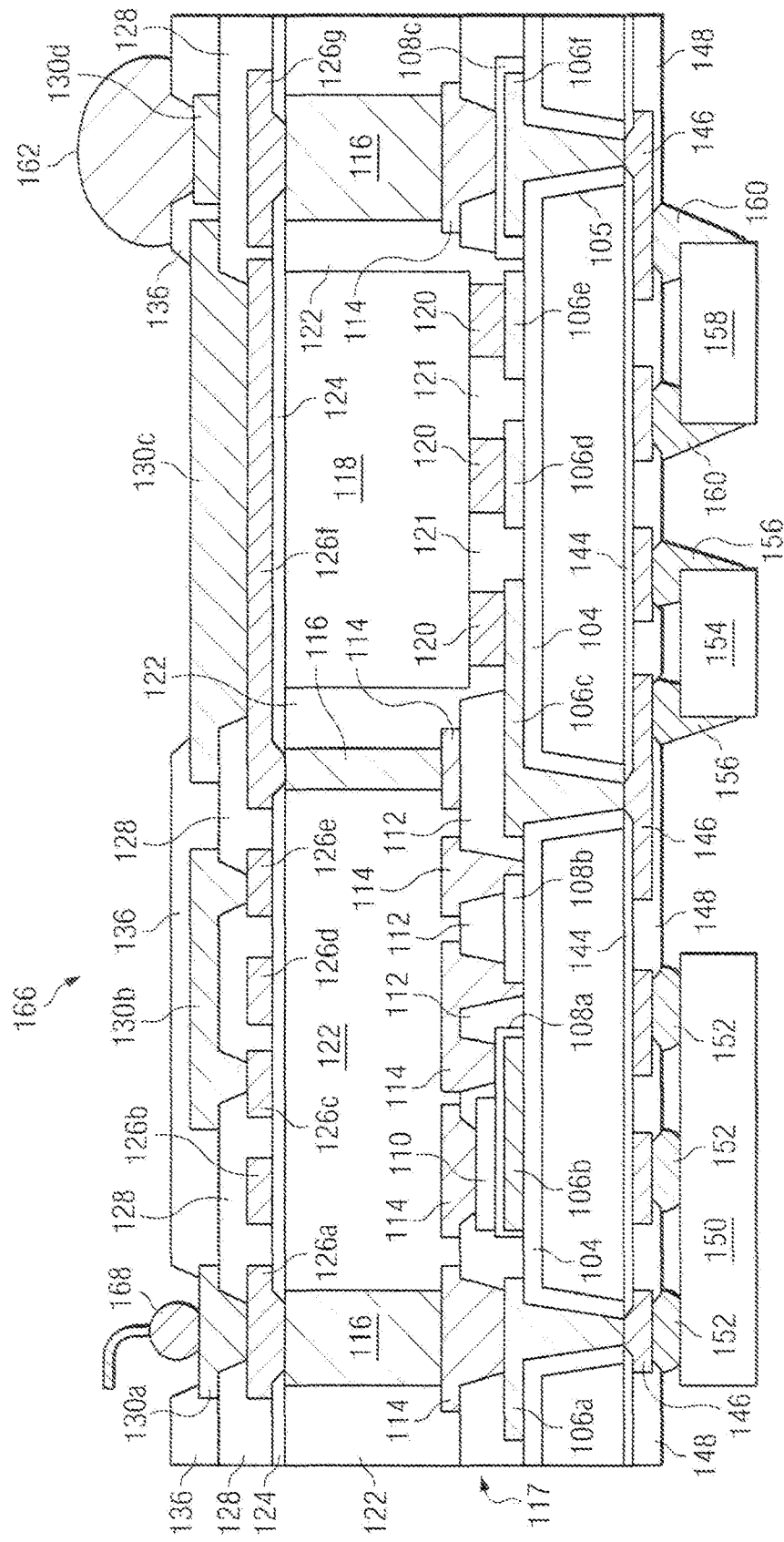
FIG. 4 illustrates the semiconductor device having a vertical interconnect structure formed through the substrate for IPD and baseband circuits.
Figure 11:
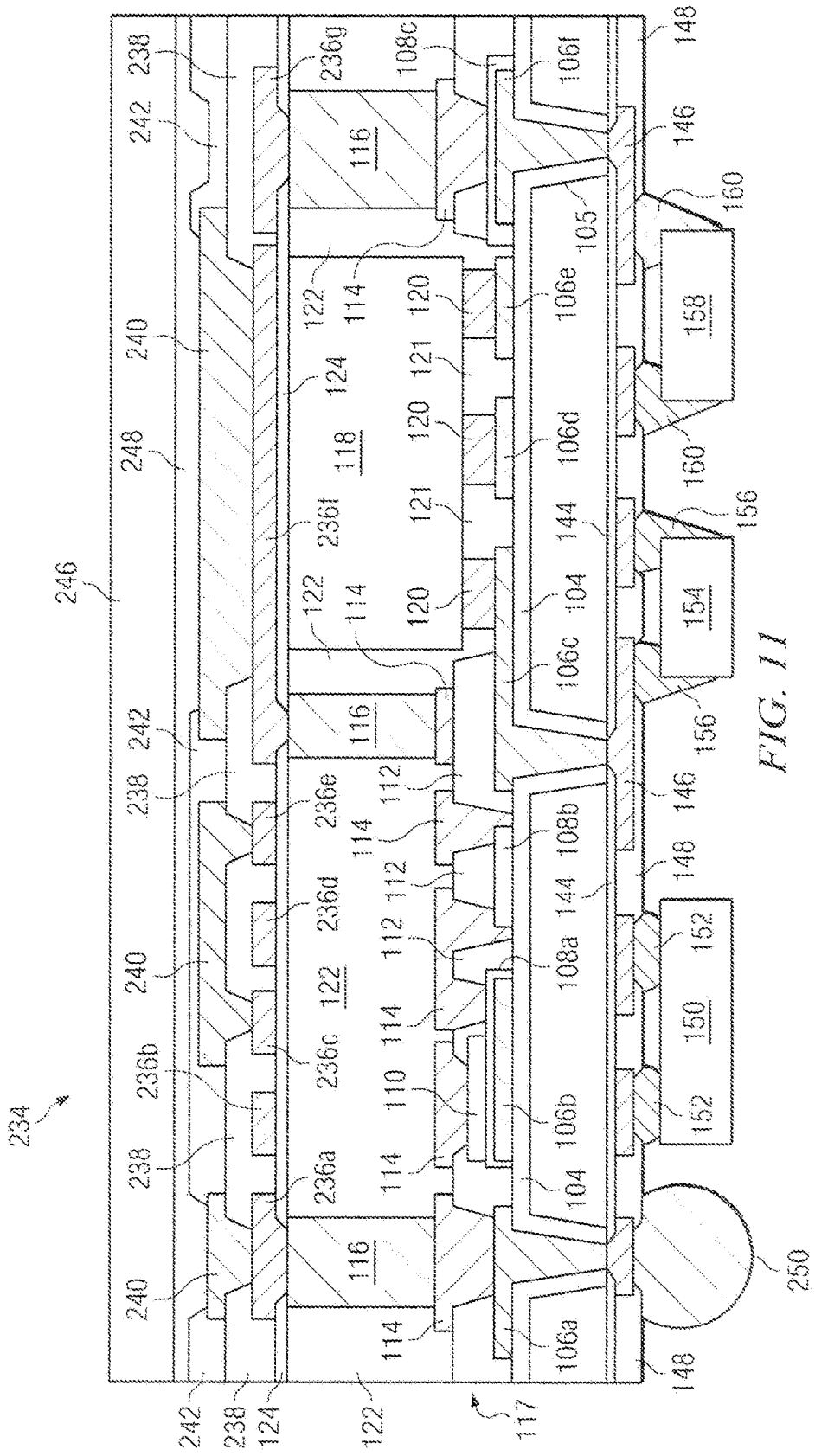
FIG. 11 illustrates the semiconductor device with a heat sink mounted over the interconnect structure.

FIG. 4 shows a semiconductor package 166 having similar features and using similar semiconductor manufacturing processes and the same references numbers as FIG. 3g. Bond wire 168 electrically connects to conductive layer 130a. Semiconductor die 150, 154, and 158 electrically connect to IPDs 117, semiconductor die 118, and external components through conductive pillars 116, solder bumps 152 and 162, bond wire 168, electrical connections 120, 156, and 162, conductive TSVs 105, and conductive layers 106, 114, 126, 130, and 146. In this embodiment, bigger solder ball not shown in FIG. 4, similar to FIG. 11, is placed on TSV side exposed 146 layer besides the electrical components, semiconductor die 150 and SMT component 154 and 158.

Figure 5:
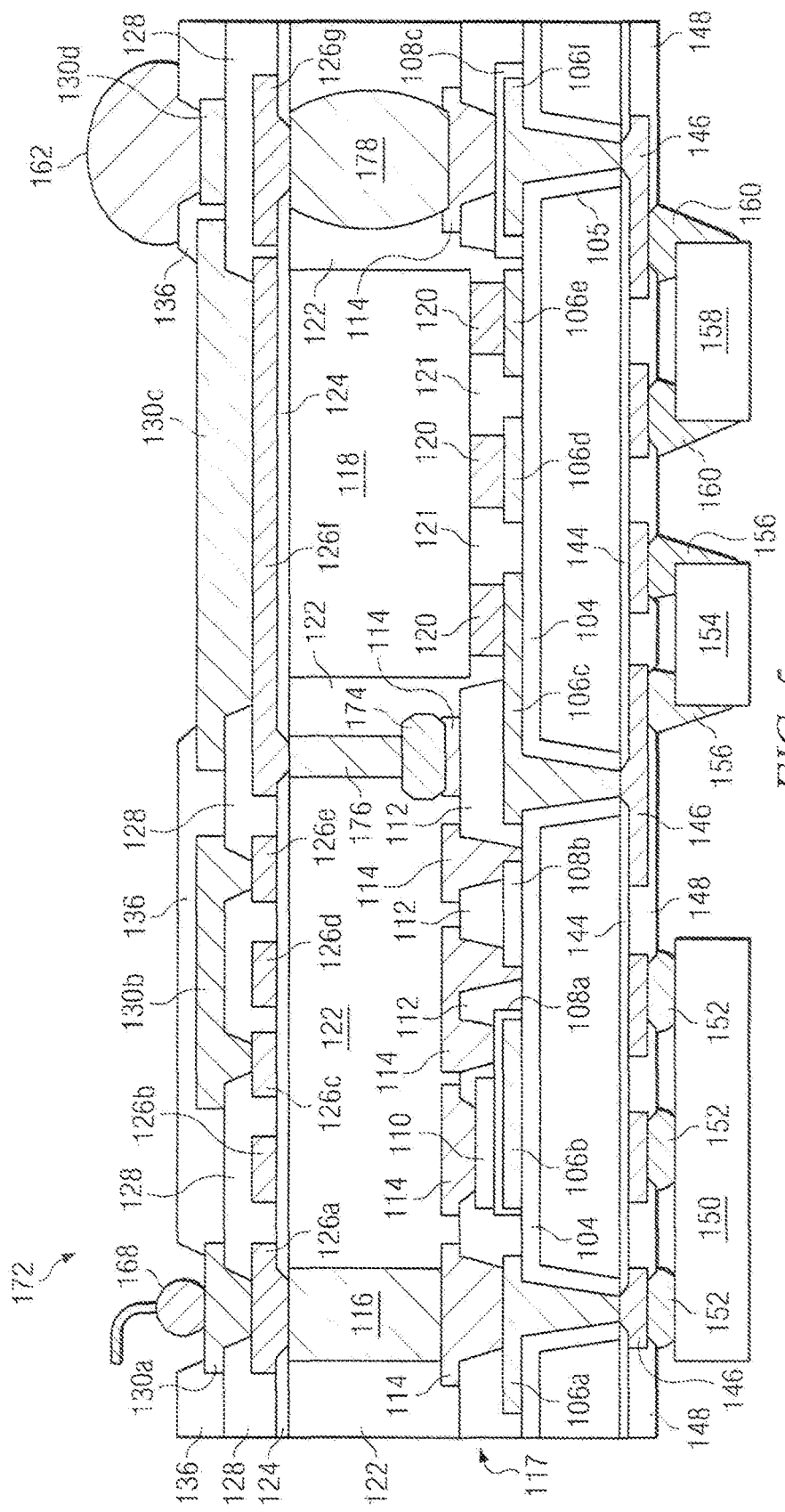
FIG. 5 illustrates the semiconductor device having a vertical interconnect structure formed through the substrate with various conductive pillars and interconnect structure.

FIG. 5 shows a semiconductor package 172 having similar features and using similar semiconductor manufacturing processes and the same references numbers as FIG. 4. The conductive pillars can be a straight vertical column 116 or a combination of bump 174 and column 176, i.e. stud bump arrangement. The conductive pillar can also be a large solder bump 178. The bottom electrode of the MIM capacitor, i.e. conductive layer 106b, can be formed with a metal different than the metal used for conductive layer 106a, 106c, and 106f in TSVs 105. In this case, conductive layer 106b is typically formed prior to conductive layer 106a, 106c, and 106f in TSVs 105. Semiconductor die 150, 154, and 158 electrically connect to IPDs 117, semiconductor die 118, and external components through conductive pillars 116 and 174-178, solder bumps 152 and 162, bond wire 168, electrical connections 120, 156, and 162, conductive TSVs 105, and conductive layers 106, 114, 126, 130, and 146.

Figure 6:
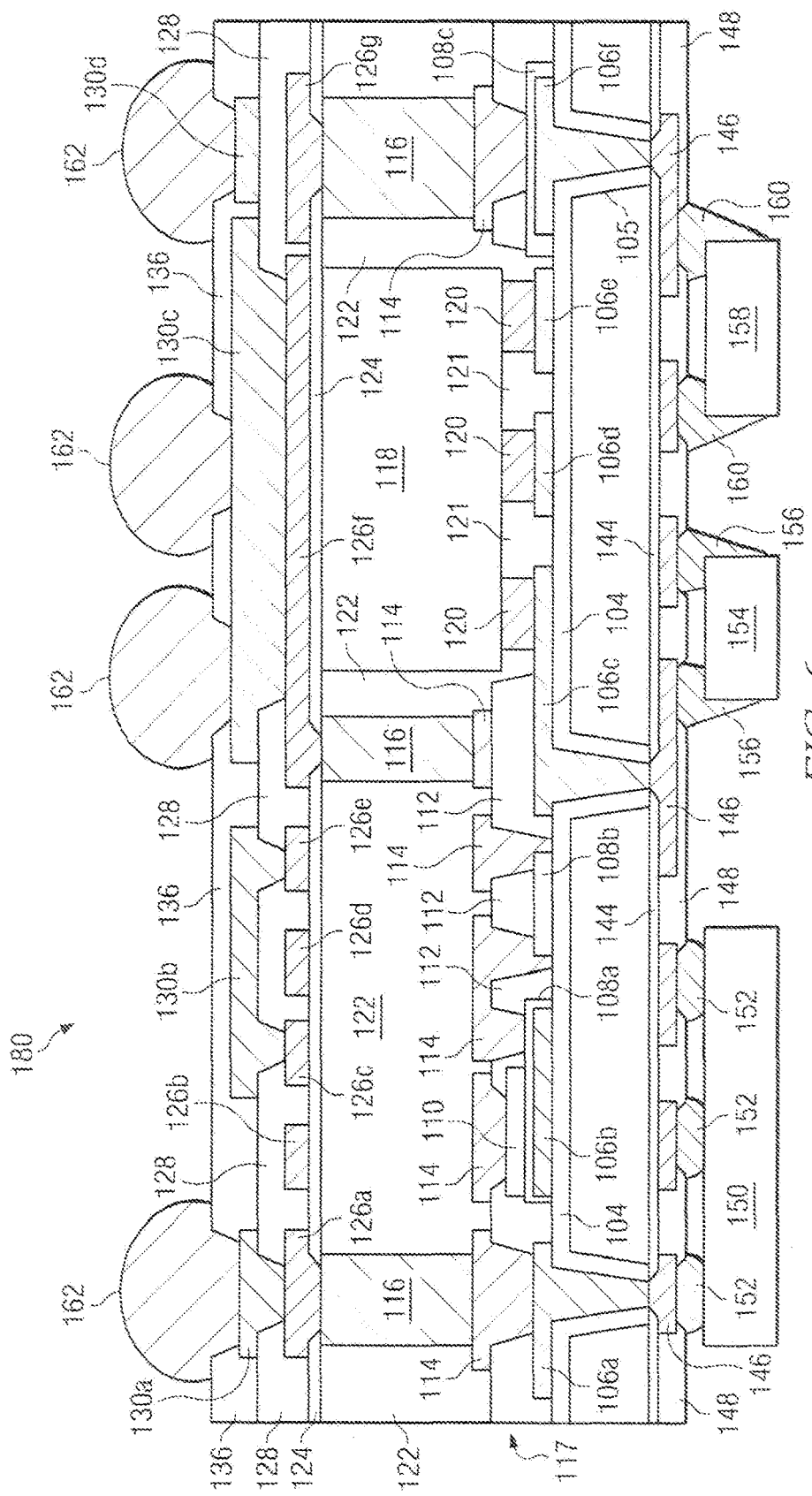
FIG. 6 illustrates the semiconductor device having a heat sink in the interconnect structure.

In FIG. 6, a semiconductor package 180 is shown with similar features, using similar semiconductor manufacturing processes and the same references numbers as FIG. 3g. Recall conductive layer 130 acts as a heat sink to dissipate thermal energy from IPD 117 and semiconductor die 118, 150, 154, and 158 by way of conductive pillars 116 and conductive layer 126 which reduces the operating temperature of these devices. Additional solder bumps 162 are formed on conductive layer 130c to thermally connect the heat sink with next level package. The heat sink conducts heat away from the semiconductor devices.

Figure 7:
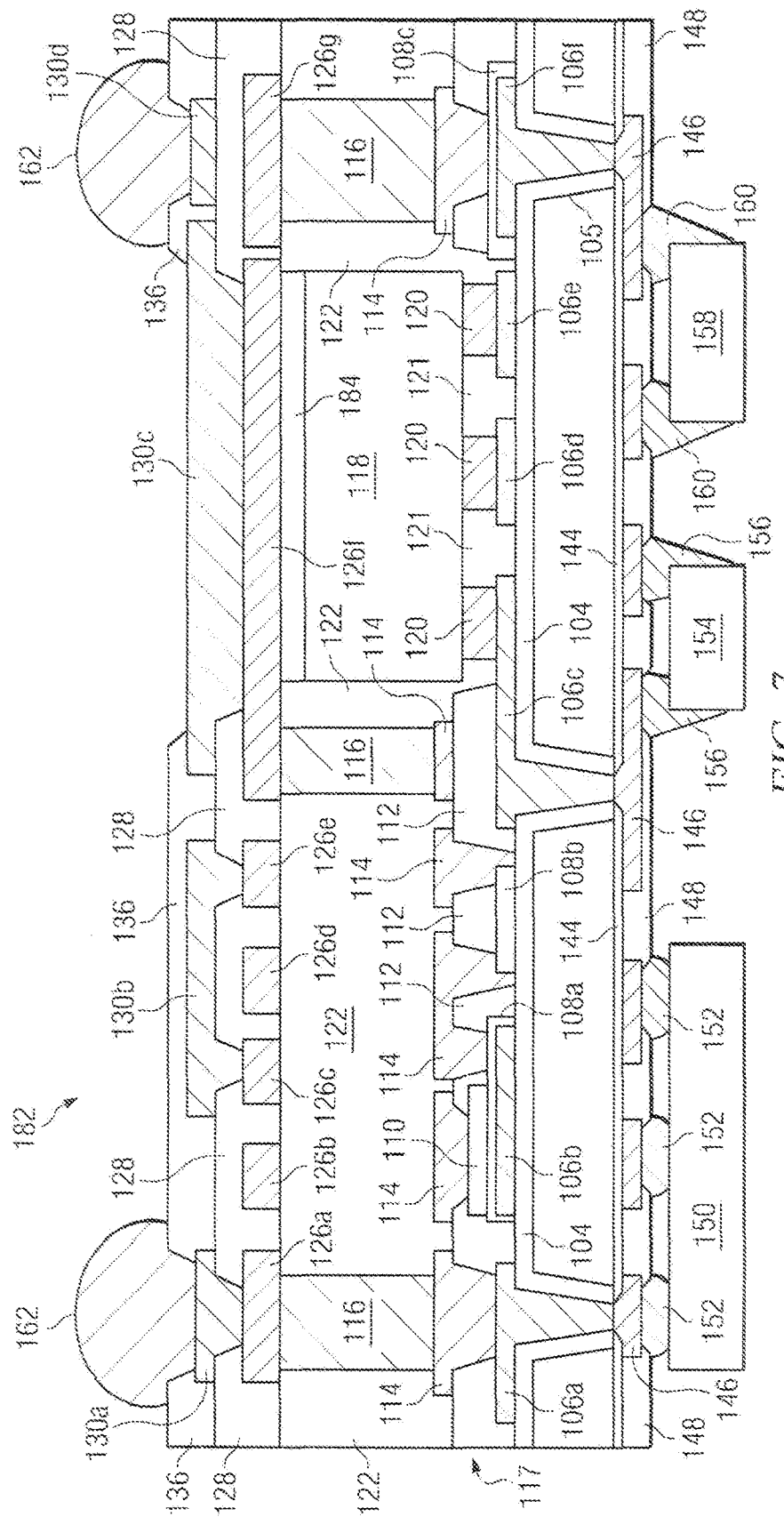
FIG. 7 illustrates the semiconductor device having an insulating layer formed over the baseband circuit.

In FIG. 7, a semiconductor package 182 is shown with similar features, using similar semiconductor manufacturing processes and the same references numbers as FIG. 3g. An insulation layer like 124 is not required in this structure. An insulating layer 184 is disposed on a backside of semiconductor die 118 as a protective coating. Semiconductor die 150, 154, and 158 electrically connect to IPDs 117, semiconductor die 118, and external components through conductive pillars 116, solder bumps 152 and 162, electrical connections 120, 156, and 162, conductive TSVs 105, and conductive layers 106, 114, 126, 130, and 146.

Figure 8:
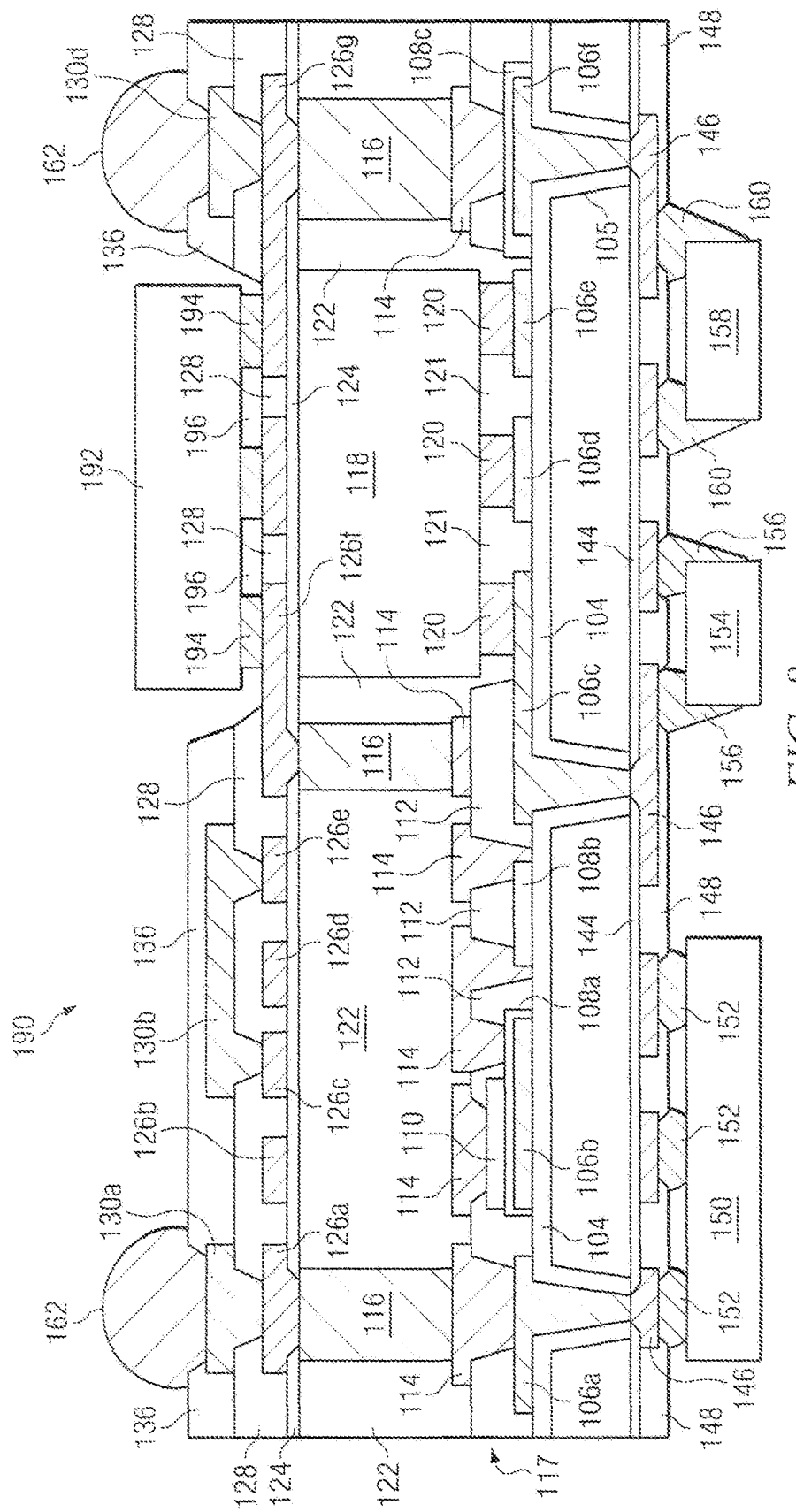
FIG. 8 illustrates the semiconductor device having a semiconductor die mounted to the interconnect structure.

In FIG. 8, a semiconductor package 190 is shown with similar features, using similar semiconductor manufacturing processes and the same references numbers as FIG. 3g. A portion of insulating layers 128 and 136 is removed by an etching process to expose conductive layer 126f-126g. A semiconductor device 192 is then mounted in the removed portion of insulating layers 128 and 136 to conductive layer 126f-126g using electrical connections 194, e.g., solder bumps, flipchip interconnect, metal bonding, or conductive paste. An underfill material 196 is optionally disposed under semiconductor device 192. Semiconductor die 150, 154, 158, and 192 electrically connect to IPDs 117, semiconductor die 118, and external components through conductive pillars 116, solder bumps 152 and 162, electrical connections 120, 156, 162, and 194, conductive TSVs 105, and conductive layers 106, 114, 126, 130, and 146.

Figure 9:
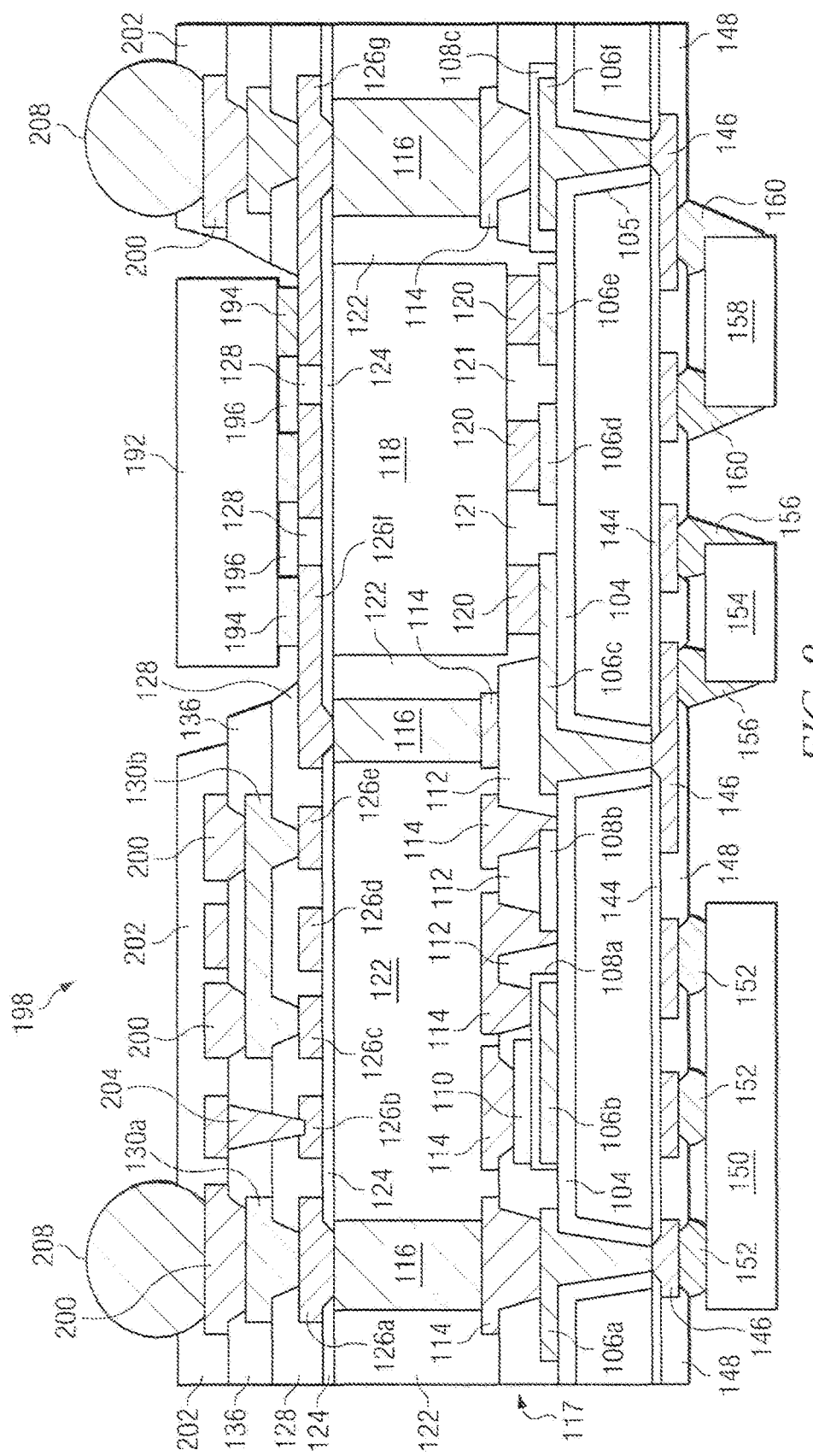
FIG. 9 illustrates another embodiment of the semiconductor device having a semiconductor die mounted to the interconnect structure.

In FIG. 9, a semiconductor package 198 is shown with similar features, using similar semiconductor manufacturing processes and the same references numbers as FIG. 8. A portion of insulating layers 128 and 136 is removed by an etching process to expose conductive layer 126f-126g. A semiconductor device 192 is then mounted in the removed portion of insulating layers 128 and 136 to conductive layer 126f-126g using electrical connections 194, e.g., solder bumps, flipchip interconnect, metal bonding, or conductive paste. An underfill material 196 is optionally disposed under semiconductor device 192.

An electrically conductive layer 200 is formed over insulating layer 136 and conductive layer 130 using a patterning and deposition process to form individual portions or sections. The individual portions of conductive layer 200 can be electrically common or electrically isolated depending on the connectivity of the semiconductor die. Conductive layer 200 can be Al, Cu, Sn, Ni, Au, Ag, or other suitable electrically conductive material. The deposition of conductive layer 200 uses PVD, CVD, electrolytic plating, or electroless plating process. The individual portions of conductive layer 200 constitute an IPD, in this case an inductor. The conductive layer 200 is typically wound or coiled in plan-view to produce or exhibit the desired inductive properties. A conductive via 204 is formed through insulating layers 128 and 136 to electrically connect conductive layers 126b and 200.

An insulating layer 202 is formed over insulating layer 136 and conductive layer 200 using a blanket process or patterning and deposition process. The insulating layer 202 can be Si3N4, SiO2, SiON, low temperature cured (<250° C.) polymer dielectric, UV cured solder resist, or other suitable insulating material. The deposition of insulating layer 202 may involve CVD, PVD, spin coating, printing, or molding process. A portion of insulating layer 202 is removed using an etching process to expose conductive layer 200.

An electrically conductive solder material is deposited over conductive layer 200 using an evaporation, electrolytic plating, electroless plating, ball drop, or screen printing process. The solder material can be any metal or electrically conductive material, e.g., Sn, Ni, Au, Ag, Pb, Bi, and alloys thereof, with an optional flux material. For example, the solder material can be eutectic Sn/Pb, high-lead, or lead-free. The solder material is reflowed by heating the material above its melting point to form spherical balls or bumps 208. Solder bumps 208 represent one type of interconnect structure that can be formed on conductive layer 200. The interconnect structure can also use bond wires, 3D interconnects, conductive paste, or other electrical interconnect.

Semiconductor die 150, 154, 158, and 192 electrically connect to IPDs 117, semiconductor die 118, and external components through conductive pillars 116, conductive via 204, solder bumps 152 and 208, electrical connections 120, 156, 162, and 194, conductive TSVs 105, and conductive layers 106, 114, 126, 130, 146, and 200.

Figure 10:
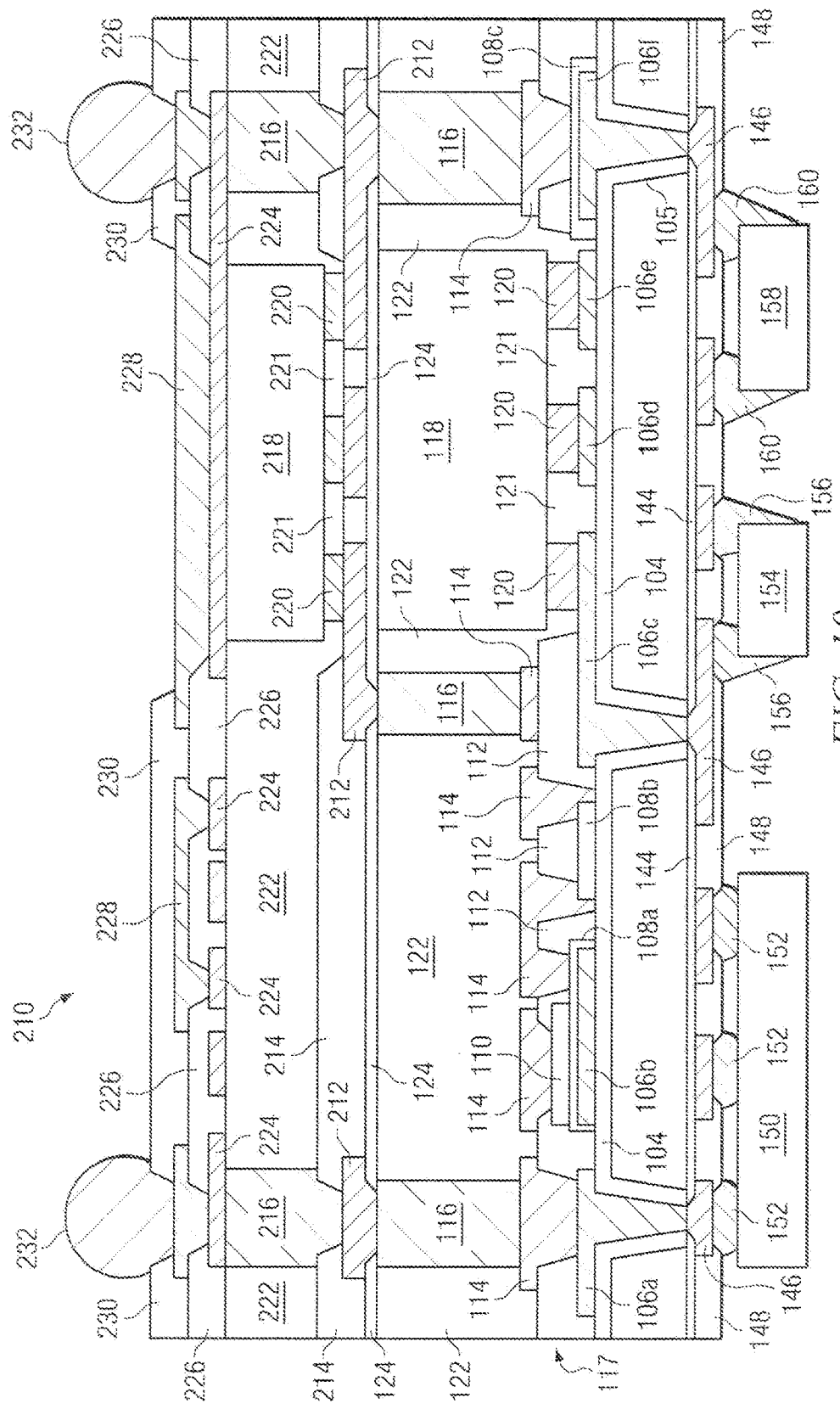
FIG. 10 illustrates the semiconductor device having a vertical interconnect structure formed through the substrate with stacked conductive pillars and baseband circuits.

In FIG. 10, a semiconductor package 210 is shown with similar features, using similar semiconductor manufacturing processes and the same references numbers as FIG. 3g, at least up to insulating layer 124. Above insulating layer 124, an electrically conductive layer 212 is formed over insulating layer 124 and conductive pillar 116 using a patterning and deposition process. Conductive layer 212 can be Al, Cu, Sn, Ni, Au, Ag, or other suitable electrically conductive material. The deposition of conductive layer 212 uses PVD, CVD, electrolytic plating, or electroless plating process.

An insulating layer 214 is formed over insulating layer 124 and conductive layer 212 using a blanket process or patterning and deposition process. The insulating layer 214 can be Si3N4, SiO2, SiON, low temperature cured (<250° C.) polymer dielectric, UV cured solder resist, or other suitable insulating material. The deposition of insulating layer 214 may involve CVD, PVD, spin coating, printing, or molding process. A portion of insulating layer 214 is removed using an etching process to expose conductive layer 212.

Conductive pillars or posts 216 are formed over conductive layer 214. Conductive pillars 216 can be Cu, Al, W, Au, solder, or other suitable electrically conductive material. Conductive pillars 216 are formed as described in FIG. 3c for conductive pillars 116.

A semiconductor device 218 is mounted to conductive layer 212 using electrical connections 220, e.g., solder bumps, metal bonding, or conductive paste. For example, semiconductor die 218 can be a baseband digital circuit, such as DSP, memory, or other signal processing circuit. An optional underfill fillet 221 is applied beneath semiconductor device 218. Note that a top surface of conductive pillar 216 and semiconductor device 218 have about the same height. Alternatively, if conductive pillar 216 and semiconductor device 218 have different heights, then semiconductor device 218 is typically made higher. In other embodiments, conductive pillars 216 are higher than semiconductor device 218.

An encapsulant or molding compound 222 is deposited around conductive pillars 216 and semiconductor device 218 using a paste printing, compressive molding, transfer molding, liquid encapsulant molding, or other suitable applicator. Encapsulant 222 extends to a top surface of conductive pillars 216. Encapsulant 222 can be epoxy resin, epoxy acrylate, polymer, or polymer composite material. Encapsulant 222 is non-conductive and environmentally protects the semiconductor device from external elements and contaminants. Encapsulant 222 has a CTE that is adjusted to match that of the base semiconductor material, e.g., Si, with Tg greater than 100° C. to reduce warpage and increase inductor Q-factor. The CTE of encapsulant 222 can be adjusted using a filler such as a powder, fiber, or cloth additive. A suitable encapsulant material is generally characterized by low-shrinkage, high-resistivity of greater than 1.0 kohm·cm, low-dielectric constant of less than 4, and low-loss tangent of less than 0.05 in 500 MHz to 30 GHz range. Encapsulant 222 undergoes grinding or etch-back to expose conductive pillars 216.

An electrically conductive layer 224 is formed over encapsulant 222 and conductive pillars 216 using a patterning and deposition process to form individual portions or sections. The individual portions of conductive layer 224 can be electrically common or electrically isolated depending on the connectivity of the semiconductor die. Conductive layer 224 can be Al, Cu, Sn, Ni, Au, Ag, or other suitable electrically conductive material. In one embodiment, conductive layer 224 is patterned with etch-back and selective plating process with an adhesion and seed layer. The deposition of conductive layer 224 may also use PVD, CVD, electrolytic plating, or electroless plating process. The conductive layer 224 constitute an IPD, in this case an inductor. The conductive layer 224 is typically wound or coiled in plan-view to produce or exhibit the desired inductive properties. Conductive layer 224 is formed over encapsulant 222. The inductor 224 is separated from IPDs 117, i.e., MIM capacitor and resistive layer 108b, by the thickness of encapsulants 122 and 222. By forming the inductor over encapsulant 222, which has high resistivity, low loss tangent, low dielectric constant, and matching CTE, high quality IPDs can be realized, without using a high-resistivity substrate. In addition, vertically separating the inductor from the MIM capacitor and resistor with high-resistivity encapsulant 222, i.e., stacking the IPDs rather than spacing them laterally across the die, saves silicon area and provides a smaller package. Other types of IPDs, such as capacitors and resistors, can be formed over the high-resistivity encapsulant 222. Conductive layer 224 electrically connects to conductive pillars 116 and 216.

An insulating layer 226 is formed over encapsulant 222 and conductive layer 224 using a blanket process or patterning and deposition process. The insulating layer 226 can be Si3N4, SiO2, SiON, low temperature cured (<250° C.) polymer dielectric, UV cured solder resist, or other suitable insulating material. The deposition of insulating layer 226 may involve CVD, PVD, spin coating, printing, or molding process. A portion of insulating layer 226 is removed using an etching process to expose conductive layer 224.

An electrically conductive layer 228 is formed over insulating layer 226 and conductive layer 224 using a patterning and deposition process to form individual portions or sections. The individual portions of conductive layer 228 can be electrically common or electrically isolated depending on the connectivity of the semiconductor die. Conductive layer 228 can be Al, Cu, Sn, Ni, Au, Ag, or other suitable electrically conductive material. The deposition of conductive layer 228 uses PVD, CVD, electrolytic plating, or electroless plating process.

An insulating layer 230 is formed over insulating layer 226 and conductive layer 228 using a blanket process or patterning and deposition process. The insulating layer 230 can be Si3N4, SiO2, SiON, low temperature cured (<250° C.) polymer dielectric, UV cured solder resist, or other suitable insulating material. The deposition of insulating layer 230 may involve CVD, PVD, spin coating, printing, or molding process. A portion of insulating layer 230 is removed using an etching process to expose conductive layer 228.

An electrically conductive solder material is deposited over conductive layer 228 using an evaporation, electrolytic plating, electroless plating, ball drop, or screen printing process. The solder material can be any metal or electrically conductive material, e.g., Sn, Ni, Au, Ag, Pb, Bi, and alloys thereof, with an optional flux material. For example, the solder material can be eutectic Sn/Pb, high-lead, or lead-free. The solder material is reflowed by heating the material above its melting point to form spherical balls or bumps 232. Solder bumps 232 represent one type of interconnect structure that can be formed on conductive layer 228. The interconnect structure can also use bond wires, 3D interconnects, conductive paste, or other electrical interconnect.

Semiconductor die 150, 154, and 158 electrically connect to IPDs 117, semiconductor die 118 and 218, and external components through conductive pillars 116 and 216, solder bumps 152 and 232, electrical connections 120, 156, 162, and 220, conductive TSV 105, and conductive layers 106, 114, 146, 212, 224, and 228. The IPDs 117 and semiconductor devices 118, 150, 154, 158, and 218 generate heat during normal operation. Conductive layer 228 acts as a heat sink to dissipate thermal energy from IPD 117 and semiconductor die 118, 150, 154, 158, and 218 by way of conductive pillars 116 and 216 and conductive layer 212 and 224 which reduces the operating temperature of these devices.

In FIG. 11, a semiconductor package 234 is shown with similar features, using similar semiconductor manufacturing processes and the same references numbers as FIG. 3g, at least up to insulating layer 124. Above insulating layer 124, an electrically conductive layer 236 is formed over encapsulant 122, insulating layer 124, and conductive pillars 116 using a patterning and deposition process to form individual portions or sections 236a-236g. The individual portions of conductive layer 236 can be electrically common or electrically isolated depending on the connectivity of the semiconductor die. Conductive layer 236 can be Al, Cu, Sn, Ni, Au, Ag, or other suitable electrically conductive material. In one embodiment, conductive layer 236 is patterned with etch-back and selective plating process with an adhesion and seed layer. The deposition of conductive layer 236 may also use PVD, CVD, electrolytic plating, or electroless plating process.

The conductive layer 236b-236e constitute an IPD, in this case an inductor. The conductive layer 236b-236e is typically wound or coiled in plan-view to produce or exhibit the desired inductive properties. The inductor 236b-236e is separated from IPDs 117, i.e., MIM capacitor and resistive layer 108b, by the thickness of encapsulant 122 and insulating layer 124, e.g., about 50 µm. By forming the inductor over encapsulant 122, which has high resistivity, low loss tangent, low dielectric constant, and matching CTE, high quality IPDs can be realized, without using a high-resistivity substrate. In addition, vertically separating the inductor from the MIM capacitor and resistor with high-resistivity encapsulant 122, i.e., stacking the IPDs rather than spacing them laterally across the die, saves silicon area and provides a smaller package.

An insulating layer 238 is formed over insulating layer 124 and conductive layer 236 using a patterning and deposition process. The insulating layer 238 can be Si3N4, SiO2, SiON, low temperature cured (<250° C.) polymer dielectric, UV cured solder resist, or other suitable insulating material. The deposition of insulating layer 238 may involve CVD, PVD, spin coating, printing, or molding process. A portion of insulating layer 238 is removed using an etching process to expose conductive layer 236a, 236c, 236e, and 236f.

An electrically conductive layer 240 is formed over insulating layer 238 and conductive layer 236 using a patterning and deposition process to form individual portions or sections. The individual portions of conductive layer 240 can be electrically common or electrically isolated depending on the connectivity of the semiconductor die. Conductive layer 240 can be Al, Cu, Sn, Ni, Au, Ag, or other suitable electrically conductive material. The deposition of conductive layer 240 uses PVD, CVD, electrolytic plating, or electroless plating process.

An insulating layer 242 is formed over insulating layer 238 and conductive layer 240 using a blanket process or patterning and deposition process. The insulating layer 242 can be Si3N4, SiO2, SiON, low temperature cured (<250° C.) polymer dielectric, UV cured solder resist, or other suitable insulating material. The deposition of insulating layer 242 may involve CVD, PVD, spin coating, printing, or molding process. A portion of insulating layer 242 is removed using an etching process to expose conductive layer 240.

A heat sink 246 is mounted to insulating layer 242 and conductive layer 240 with adhesive 248. The IPDs 117 and semiconductor devices 118, 150, 154, and 158 generate heat during normal operation. Heat sink 246 dissipates thermal energy from IPD 117 and semiconductor die 118, 150, 154, and 158 by way of conductive pillars 116 and conductive layer 236 and 240 which reduces the operating temperature of these devices.

An electrically conductive solder material is deposited over conductive layer 146 using an evaporation, electrolytic plating, electroless plating, ball drop, or screen printing process. The solder material can be any metal or electrically conductive material, e.g., Sn, Ni, Au, Ag, Pb, Bi, and alloys thereof, with an optional flux material. For example, the solder material can be eutectic Sn/Pb, high-lead, or lead-free. The solder material is reflowed by heating the material above its melting point to form spherical balls or bumps 250. Solder bumps 250 have typically higher stand-off than electrical components or semiconductor die 150, SMT components 154 and 158. Solder bumps 250 represent one type of interconnect structure that can be formed on conductive layer 146. The interconnect structure can also use bond wires, 3D interconnects, conductive paste, or other electrical interconnect.

Figure 12:
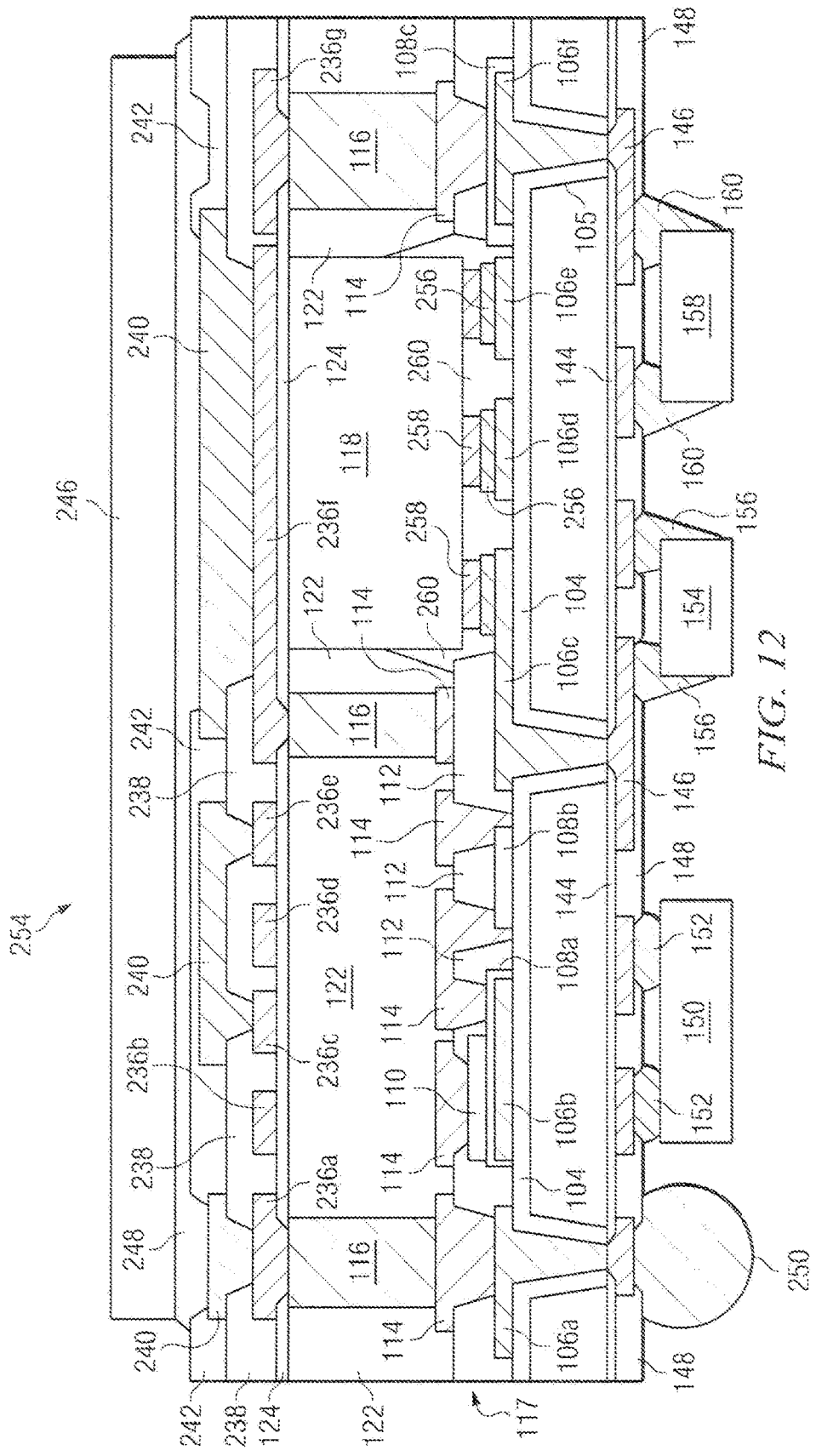
FIG. 12 illustrates another embodiment of the semiconductor device having a heat sink mounted over the interconnect structure.

In FIG. 12, a semiconductor package 254 is shown with similar features, using similar semiconductor manufacturing processes and the same references numbers as FIG. 11. An electrically conductive layer 256 is formed over conductive layer 106c, 106d, and 106e using a patterning and deposition process. An electrically conductive layer 258 is formed over conductive layer 256 using a patterning and deposition process. Conductive layers 256 and 258 can be Al, Cu, Sn, Ni, Au, Ag, or other suitable electrically conductive material. The deposition of conductive layers 256 and 258 uses PVD, CVD, electrolytic plating, or electroless plating process. An underfill material 260 is deposited beneath semiconductor die 118.

Figure 13:
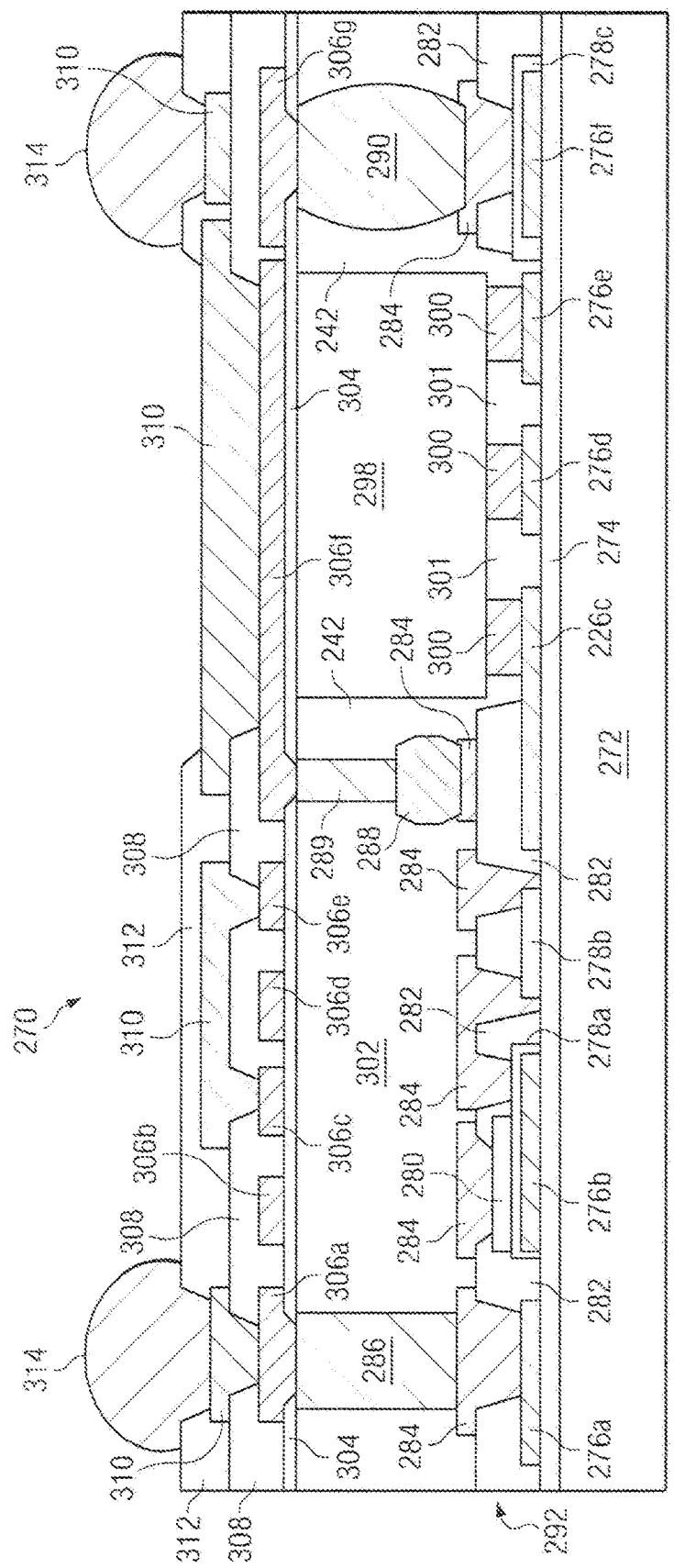
FIG. 13 illustrates the semiconductor device without vertical interconnect structure formed through the substrate.

In FIG. 13, substrate 272 contains dummy or sacrificial base material such as Si, polymer, polymer composite, metal, ceramic, glass, glass epoxy, beryllium oxide, or other suitable low-cost, rigid material or bulk semiconductor material for structural support. Alternatively, substrate 272 can be other semiconductor base materials such as germanium, gallium arsenide, indium phosphide, or silicon carbide.

An insulating or passivation layer 274 is formed on substrate 272. The insulating layer 274 can be SiO2, Si3N4, SiON, Ta2O5, ZrO2, Al2O3, or other material having similar insulating and structural properties. The insulating layer 274 is conformally deposited using PVD, CVD, printing, sintering or thermal oxidation. The insulating layer 274 can be made with single or multiple layers.

An electrically conductive layer 276 is formed on insulating layer 274 using a patterning and deposition process to form individual portions or sections 276a-276f. The individual portions of conductive layer 276 can be electrically common or electrically isolated depending on the connectivity of the semiconductor die. The deposition of conductive layer 276 uses PVD, CVD, electrolytic plating, or electroless plating process. In one embodiment, conductive layer 276 is stacked Ti/NiV/Cu or Al/NiV/Cu with Ti or AL as an adhesive layer, NiV as a barrier layer, and Cu as a wetting layer. Alternately, conductive layer 276 can be Al, Cu, Sn, Ni, Au, Ag, or other suitable electrically conductive material with optional adhesion and barrier layers containing Ti, TiW, TiN, Ta, or TaN. The seed layer and adhesion/barrier layer are etched using conductive layer 276 as a hard mark. The surface of conductive layer 276 can be smoothed by CMP for later formation of passive devices.

A resistive layer 278 is patterned and deposited on conductive layers 276 and insulating layer 274 using PVD or CVD. Resistive layer 278 has individual portions or sections 278a-278c. Resistive layer 278a is deposited over conductive layer 276b. Resistive layer 278b is deposited over insulating layer 274 between conductive layers 276b-276c. Resistive layer 278c is formed over conductive layer 276f. Resistive layer 278 is TaxSiy or other metal silicides, TaN, NiCr, TiN, or doped poly-silicon having a resistivity between 5 and 100 ohm/sq. The seed layer for conductive layer 276 may be formed after deposition of resistive layer 278.

An insulating layer 280 is formed over resistive layer 278a using a patterning and deposition process. The insulating layer 280 is Si3N4, SiO2, SiON, Ta2O5, ZnO, ZrO2, Al2O3, or other suitable dielectric material. The deposition of insulating layer 280 may involve PVD, CVD, spin coating, or printing. Resistive layer 278 and insulating layer 280 are formed with the same mask and etched at the same time. Alternatively, resistive layer 278 and insulating layer 280 can be patterned and etched with a different mask.

A passivation layer 282 is formed over insulating layer 274, conductive layer 276, resistive layer 278, and insulating layer 280. Passivation layer 282 can be polyimide, BCB, PBO, SiO2, Si3N4, SiON, Ta2O5, Al2O3, or other similar insulating and structural properties. The deposition of passivation layer 282 may involve spin coating, PVD, CVD, printing, sintering, or thermal oxidation. A portion of passivation layer 282 is removed to expose conductive layer 276a, insulating layer 280, resistive layer 278a-278c, insulating layer 274, and conductive layer 276c-276e.

An electrically conductive layer 284 is formed over conductive layer 276a, insulating layer 280, insulating layer 274, resistive layer 278a-278c, and passivation layer 282. Conductive layer 284 is Al, Cu, Sn, Ni, Au, Ag, or other suitable electrically conductive material. In one embodiment, conductive layer 284 is patterned with etch-back and selective plating process. The deposition of conductive layer 284 may also use PVD, CVD, electrolytic plating, or electroless plating process. Conductive layer 284 uses an adhesion layer of Ti or TiW.

Conductive pillars or posts are formed over conductive layer 284. The conductive pillars can be a straight vertical column 286 or a combination of bump 288 and column 289, i.e. stud bump arrangement. The conductive pillar can also be a large solder bump 290. Conductive pillars 286-290 can be Cu, Al, W, Au, solder, or other suitable electrically conductive material. The conductive pillars 286-290 are formed the same process as described for conductive pillars 116 in FIG. 3c.

The combination of conductive layer 276, resistive layer 278, insulating layer 280, and conductive layer 274, constitute one or more passive circuit elements or IPDs 292. For example, conductive layer 276b, resistive layer 278a, insulating layer 280, and conductive layer 284 is a MIM capacitor. Resistive layer 278b is a resistor element in the passive circuit. The MIM capacitor and resistor are formed with process temperature greater than 200° C. The resistor is optional. Other active and passive circuit elements can be formed on the wafer as part of the electrically functional semiconductor device. The IPDs 292 contained within the wafer provide the electrical characteristics needed for high frequency applications, such as resonators, high-pass filters, low-pass filters, band-pass filters, symmetric Hi-Q resonant transformers, matching networks, and tuning capacitors.

A semiconductor device 298 is mounted to conductive layer 276c-276e using electrical connections 300, e.g., solder bumps, flipchip interconnect, metal bonding, or conductive paste. For example, semiconductor die 298 can be a baseband digital circuit, such as DSP, memory, or other signal processing circuit. An optional underfill fillet 301 is applied beneath semiconductor device 298. Note that a top surface of conductive pillar 286-290 and semiconductor device 298 have about the same height. Alternatively, if conductive pillars 286-290 and semiconductor device 298 have different heights, then semiconductor device 298 is typically made higher. In other embodiments, conductive pillars 286-290 are higher than semiconductor device 298.

An encapsulant or molding compound 302 is deposited over the IPD structure and around conductive pillars 286-290 and semiconductor device 298 using a paste printing, compressive molding, transfer molding, liquid encapsulant molding, or other suitable applicator. Encapsulant 302 extends to a top surface of conductive pillars 286-290. Encapsulant 302 can be epoxy resin, epoxy acrylate, polymer, or polymer composite material. Encapsulant 302 is non-conductive and environmentally protects the semiconductor device from external elements and contaminants. Encapsulant 302 has a CTE that is adjusted to match that of the base semiconductor material, e.g., Si, with Tg greater than 100° C. to reduce warpage and increase inductor Q-factor. The CTE of encapsulant 302 can be adjusted using a filler such as a powder, fiber, or cloth additive. A suitable encapsulant material is generally characterized by low-shrinkage, high-resistivity of greater than 1.0 kohm·cm, low-dielectric constant of less than 4, and low-loss tangent of less than 0.05 in 500 MHz to 30 GHz range. Encapsulant 302 undergoes grinding or etch-back to expose conductive pillars 286-290.

An insulating layer 304 is formed over conductive pillars 286-290, semiconductor device 298, and encapsulant 302 using spin coating or laminate with an adhesive. The insulating layer 304 can be SiO2, Si3N4, SiON, Ta2O5, Al2O3, or other suitable material. The deposition of passivation layer 304 may involve spin coating, PVD, CVD, printing, sintering, or thermal oxidation. A portion of insulating layer 304 is removed using an etching process to expose conductive pillars 286-290. The insulating layer 304 is optional.

An electrically conductive layer 306 is formed over encapsulant 302, insulating layer 304, and conductive pillars 286-290 using a patterning and deposition process to form individual portions or sections 306a-306g. The individual portions of conductive layer 306 can be electrically common or electrically isolated depending on the connectivity of the semiconductor die. Conductive layer 306 can be Al, Cu, Sn, Ni, Au, Ag, or other suitable electrically conductive material. In one embodiment, conductive layer 306 is patterned with etch-back and selective plating process with an adhesion and seed layer. The deposition of conductive layer 306 may also use PVD, CVD, electrolytic plating, or electroless plating process.

An insulating layer 308 is formed over insulating layer 304 and conductive layer 306 using a patterning and deposition process. The insulating layer 308 can be Si3N4, SiO2, SiON, Ta2O5, ZnO, ZrO2, Al2O3, or other suitable insulating material. The deposition of insulating layer 308 may involve CVD, PVD, spin coating, printing, or molding process. A portion of insulating layer 308 is removed using an etching process to expose conductive layer 306a, 306c, 306e, and 306f.

An electrically conductive layer 310 is formed over insulating layer 308 and conductive layer 306 using a patterning and deposition process. Conductive layer 310 can be Al, Cu, Sn, Ni, Au, Ag, or other suitable electrically conductive material. The deposition of conductive layer 310 uses PVD, CVD, electrolytic plating, or electroless plating process.

An insulating layer 312 is formed over insulating layer 308 and conductive layer 310 using a blanket process or patterning and deposition process. The insulating layer 312 can be Si3N4, SiO2, SiON, Ta2O5, ZnO, ZrO2, Al2O3, or other suitable insulating material. The deposition of insulating layer 312 may involve CVD, PVD, spin coating, printing, or molding process. A portion of insulating layer 312 is removed using an etching process to expose conductive layer 310.

The conductive layer 306b-306e constitute an IPD, in this case an inductor. The conductive layer 306b-306e is typically wound or coiled in plan-view to produce or exhibit the desired inductive properties. Conductive layer 306b-306e is formed over encapsulant 302 and insulating layer 304. The inductor 306b-306e is separated from IPDs 292, i.e., MIM capacitor and resistive layer 278b, by the thickness of encapsulant 302 and insulating layer 304, e.g., about 50 µm. By forming the inductor over encapsulant 302, which has high resistivity, low loss tangent, low dielectric constant, and matching CTE, high quality IPDs can be realized, without using a high-resistivity substrate. In addition, vertically separating the inductor from the MIM capacitor and resistor with high-resistivity encapsulant 302, i.e., stacking the IPDs rather than spacing them laterally across the die, saves silicon area and provides a smaller package. Other types of IPDs, such as capacitors and resistors, can be formed over the high-resistivity encapsulant 302 and insulating layer 304. Conductive layer 306a, 306f, and 306g electrically connect to conductive pillars 286-290.

An electrically conductive solder material is deposited over conductive layer 310 using an evaporation, electrolytic plating, electroless plating, ball drop, or screen printing process. The solder material can be any metal or electrically conductive material, e.g., Sn, Ni, Au, Ag, Pb, Bi, and alloys thereof, with an optional flux material. For example, the solder material can be eutectic Sn/Pb, high-lead, or lead-free. The solder material is reflowed by heating the material above its melting point to form spherical balls or bumps 314. In some applications, solder bumps 314 are reflowed a second time to improve electrical contact to conductive layer 310. Solder bumps 314 represent one type of interconnect structure that can be formed on conductive layer 310. The interconnect structure can also use bond wires, 3D interconnects, conductive paste, or other electrical interconnect.

Semiconductor die 298 electrically connects to IPDs 292, and external components through conductive pillars 286-290, solder bumps 314, electrical connections 300, and conductive layers 276, 284, 306, and 310. The IPDs 292 and semiconductor die 298 generate heat during normal operation. Conductive layer 310 acts as a heat sink to conduct thermal energy away from IPD 292 and semiconductor die 298 by way of conductive pillars 286-290 and conductive layer 306 which reduces the operating temperature of these devices.

While one or more embodiments of the present invention have been illustrated in detail, the skilled artisan will appreciate that modifications and adaptations to those embodiments may be made without departing from the scope of the present invention as set forth in the following claims.

What is claimed:
1. A semiconductor device, comprising:
a semiconductor substrate;
a first semiconductor die disposed over a first surface of the semiconductor substrate;
a capacitor formed over the first surface of the semiconductor substrate and laterally offset from the first semiconductor die, the capacitor including,
(a) a first conductive layer formed over the first surface of the semiconductor substrate,
(b) an insulating layer formed over the first conductive layer, and
(c) a second conductive layer formed over the insulating layer;
an encapsulant deposited around the first semiconductor die and over the capacitor;
a vertical interconnect structure formed through the encapsulant; and
a third conductive layer formed over a surface of the encapsulant opposite the capacitor, wherein the third conductive layer is in physical contact with the vertical interconnect structure and a portion of the third conductive layer is wound to form an inductor.

2. The semiconductor device of claim 1, further including a resistor formed over the first conductive layer.

3. The semiconductor device of claim 1, wherein a thickness of the encapsulant over the capacitor is at least 50 micrometers.

4. The semiconductor device of claim 1, further including a second semiconductor die disposed over a second surface of the semiconductor substrate opposite the first surface of the semiconductor substrate.

5. The semiconductor device of claim 1, further including a heat sink disposed over the first semiconductor die.

6. The semiconductor device of claim 1, further including a second semiconductor die disposed over the first semiconductor die.

7. A semiconductor device, comprising:
a semiconductor substrate;
a conductive via formed through the semiconductor substrate;
a first semiconductor die disposed over a first surface of the semiconductor substrate;
a first integrated passive device (IPD) formed over the first surface of the semiconductor substrate and laterally offset from the first semiconductor die;
an encapsulant deposited in contact with the first semiconductor die and first IPD; and
a second IPD formed over a surface of the encapsulant opposite the first IPD and laterally offset from the first semiconductor die, wherein the second IPD includes a first conductive layer formed over the surface of the encapsulant and wound to form an inductor.

8. The semiconductor device of claim 7, wherein the first IPD includes a capacitor or resistor.

9. The semiconductor device of claim 7, further including a heat sink disposed over the first semiconductor die.

10. The semiconductor device of claim 7, further including an interconnect structure formed through the encapsulant, wherein the first conductive layer formed over the surface of the encapsulant contacts the interconnect structure.

11. The semiconductor device of claim 7, further including a second semiconductor die disposed over the first semiconductor die.

12. A semiconductor device, comprising:
a substrate including a semiconductor material;
a first semiconductor die disposed over a first surface of the substrate;
a first integrated passive device (IPD) disposed over the first surface of the substrate and laterally offset from the first semiconductor die;
an encapsulant deposited over the first IPD; and
a second IPD formed over a surface of the encapsulant opposite the first IPD and laterally offset from the first semiconductor die, wherein the second IPD includes a first conductive layer formed over the surface of the encapsulant opposite the first IPD and wound to form an inductor.

13. The semiconductor device of claim 12, further including a conductive via formed through the substrate.

14. The semiconductor device of claim 12, further including a second semiconductor die disposed over the first semiconductor die.

15. The semiconductor device of claim 12, wherein the first IPD includes a capacitor or resistor.

16. The semiconductor device of claim 12, wherein the first IPD includes:
a second conductive layer;
an insulating layer formed over the second conductive layer; and
a third conductive layer formed over the insulating layer.

17. The semiconductor device of claim 12, further including an interconnect structure formed through the encapsulant, wherein the first conductive layer contacts the interconnect structure.

18. A semiconductor device, comprising:
a substrate including a semiconductor material;
a first semiconductor die disposed over a surface of the substrate;
an integrated passive device (IPD) disposed over the surface of the substrate laterally offset from the first semiconductor die;
an encapsulant deposited over the IPD;
an interconnect structure formed through the encapsulant; and
a first conductive layer wound to form an inductor over a surface of the encapsulant opposite the IPD and in contact with the interconnect structure.

19. The semiconductor device of claim 18, further including a second semiconductor die disposed over the first semiconductor die.

20. The semiconductor device of claim 18, wherein the IPD includes a capacitor or resistor.

21. The semiconductor device of claim 18, wherein the IPD includes:
a second conductive layer formed over the surface of the substrate;
an insulating layer formed over the second conductive layer; and
a third conductive layer formed over the insulating layer.

22. The semiconductor device of claim 18, further including an insulating layer formed over the encapsulant, wherein the first conductive layer is formed over the insulating layer.

23. The semiconductor device of claim 7, wherein the first IPD includes:
a second conductive layer formed over the first surface of the semiconductor substrate;
an insulating layer formed over the second conductive layer; and
a third conductive layer formed over the insulating layer.

24. The semiconductor device of claim 1, further including a plurality of conductive vias formed through the semiconductor substrate.

25. The semiconductor device of claim 7, further including a second semiconductor die disposed over a second surface of the semiconductor substrate opposite the first surface of the semiconductor substrate.

26. The semiconductor device of claim 12, further including a second conductive layer formed over the second IPD.

* * * * *